(12) United States Patent
Jang et al.

(10) Patent No.: US 9,373,574 B2
(45) Date of Patent: Jun. 21, 2016

(54) SEMICONDUCTOR PACKAGES AND METHODS OF FORMING THE SAME

(71) Applicants: Ae-nee Jang, Seoul (KR); Young Lyong Kim, Gunpo-si (KR); Jaegwon Jang, Hwaseong-si (KR)

(72) Inventors: Ae-nee Jang, Seoul (KR); Young Lyong Kim, Gunpo-si (KR); Jaegwon Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 156 days.

(21) Appl. No.: 13/935,456

(22) Filed: Jul. 3, 2013

(65) Prior Publication Data

US 2014/0008797 A1 Jan. 9, 2014

(30) Foreign Application Priority Data

Jul. 5, 2012 (KR) .................. 10-2012-0073430

(51) Int. Cl.
*H01L 23/13* (2006.01)
*H01L 23/498* (2006.01)
*H01L 21/56* (2006.01)
*H01L 23/00* (2006.01)
*H01L 25/065* (2006.01)

(52) U.S. Cl.
CPC ........ *H01L 23/49816* (2013.01); *H01L 21/561* (2013.01); *H01L 21/565* (2013.01); *H01L 23/13* (2013.01); *H01L 24/97* (2013.01); *H01L 25/0657* (2013.01); *H01L 23/49838* (2013.01); *H01L 24/73* (2013.01); *H01L 2224/0401* (2013.01); *H01L 2224/04042* (2013.01); *H01L 2224/0557* (2013.01); *H01L 2224/06181* (2013.01); *H01L 2224/16145* (2013.01); *H01L 2224/32145* (2013.01); *H01L 2224/32225* (2013.01); *H01L 2224/45139* (2013.01); *H01L 2224/48227* (2013.01); *H01L 2224/73207* (2013.01); *H01L 2224/73253* (2013.01); *H01L 2224/73265* (2013.01); *H01L 2224/81193* (2013.01); *H01L 2224/97* (2013.01); *H01L 2225/0651* (2013.01); *H01L 2225/06513* (2013.01); *H01L 2225/06541* (2013.01); *H01L 2924/00014* (2013.01); *H01L 2924/12042* (2013.01); *H01L 2924/15151* (2013.01); *H01L 2924/15159* (2013.01); *H01L 2924/15311* (2013.01); *H01L 2924/181* (2013.01)

(58) Field of Classification Search
CPC . H01L 23/49816; H01L 23/498; H01L 23/13; H01L 25/0657; H01L 24/97
See application file for complete search history.

(56) References Cited

U.S. PATENT DOCUMENTS

| 5,841,192 | A | * | 11/1998 | Exposito | ................. H01L 21/56 257/701 |
| 7,888,602 | B2 | | 2/2011 | Park | |
| 2007/0023887 | A1 | * | 2/2007 | Matsui | ................... H01L 24/73 257/686 |

(Continued)

FOREIGN PATENT DOCUMENTS

| KR | 19970030696 | 6/1997 |
| KR | 19980083359 | 12/1998 |

(Continued)

*Primary Examiner* — Whitney T Moore
*Assistant Examiner* — Joseph Galvin, III
(74) *Attorney, Agent, or Firm* — Renaissance IP Law Group LLP

(57) ABSTRACT

Disclosed are semiconductor packages and methods of forming the same. In the semiconductor packages and the methods, a package substrate includes a hole not overlapped with semiconductor chips. Thus, a molding layer may be formed without a void.

13 Claims, 28 Drawing Sheets

(56) References Cited

U.S. PATENT DOCUMENTS

| | | |
|---|---|---|
| 2008/0298029 A1 | 12/2008 | Park |
| 2009/0017583 A1 | 1/2009 | Jun et al. |
| 2011/0193228 A1 | 8/2011 | Yu et al. |
| 2012/0032328 A1 | 2/2012 | Lin et al. |
| 2013/0105988 A1* | 5/2013 | Lee et al. .................. 257/774 |

FOREIGN PATENT DOCUMENTS

| | | |
|---|---|---|
| KR | 20010063236 A | 7/2001 |
| KR | 20070105613 A | 10/2007 |
| KR | 20080065795 A | 7/2008 |
| KR | 20100124407 A | 11/2010 |

\* cited by examiner

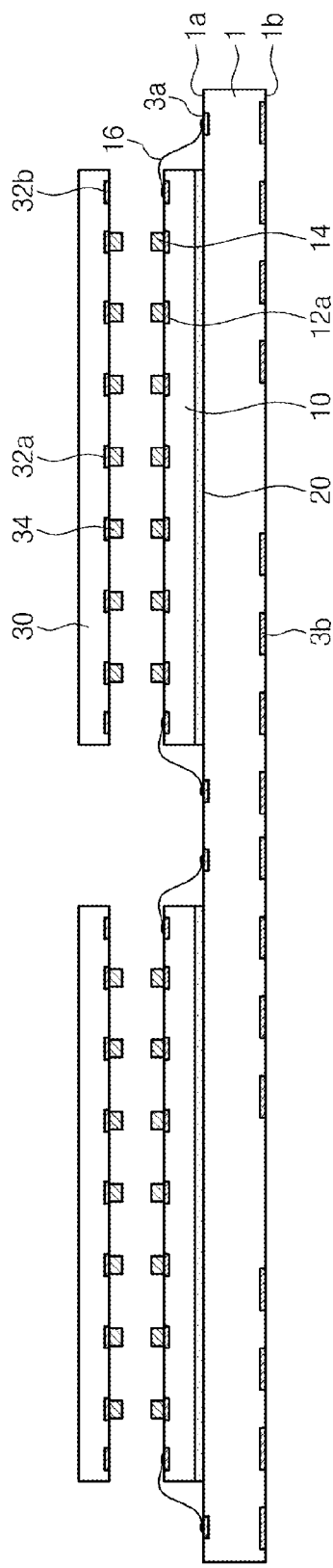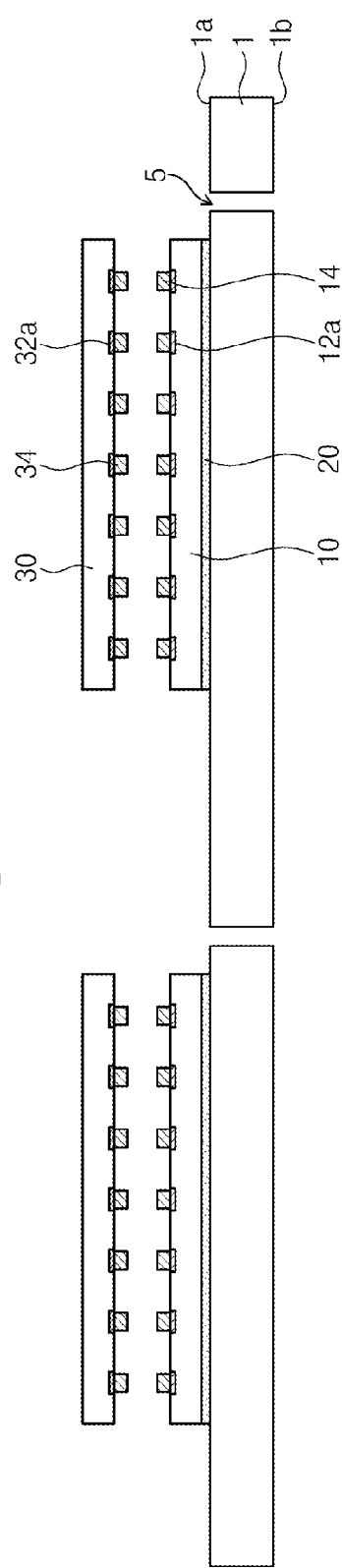

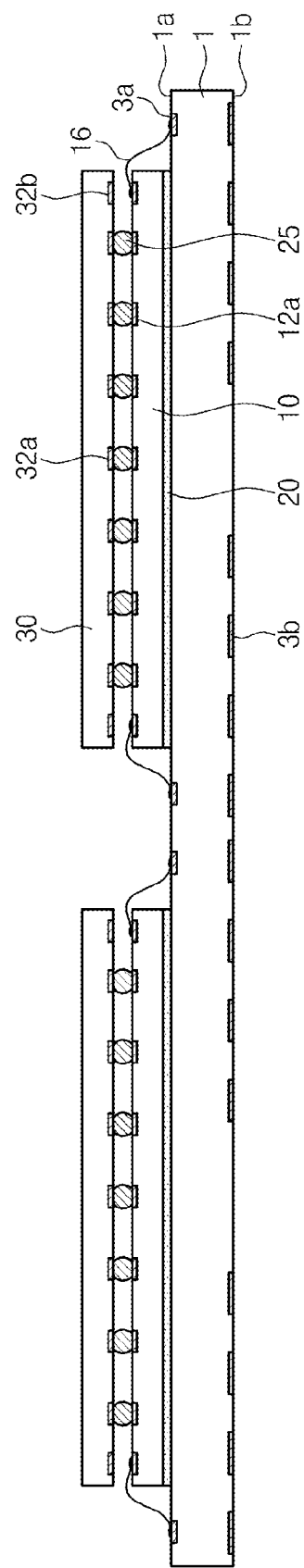
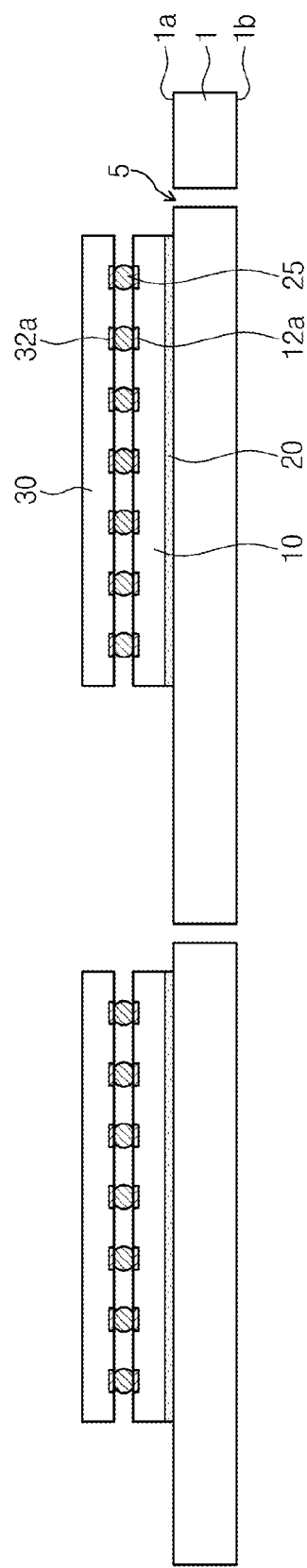

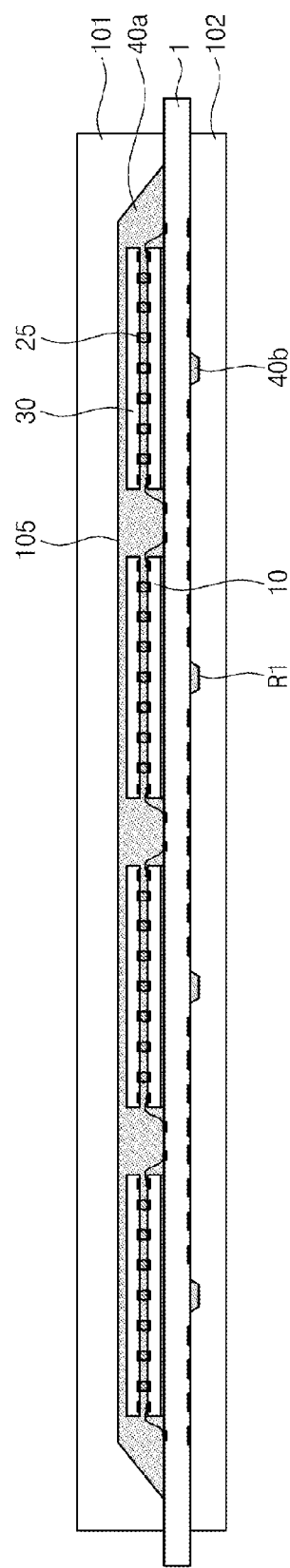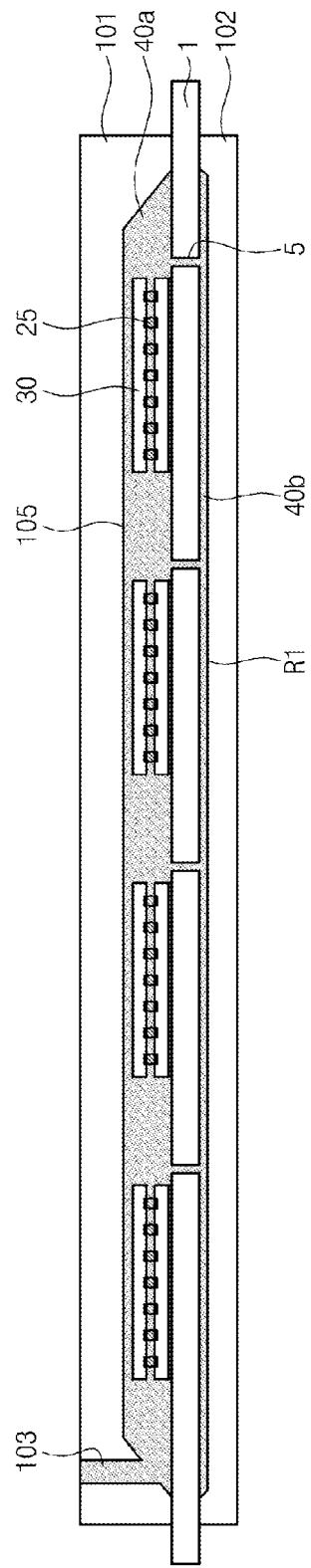

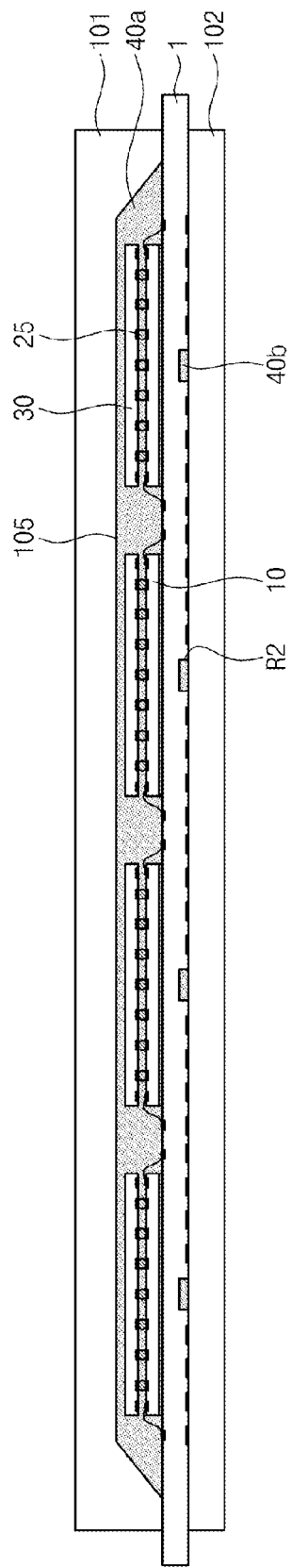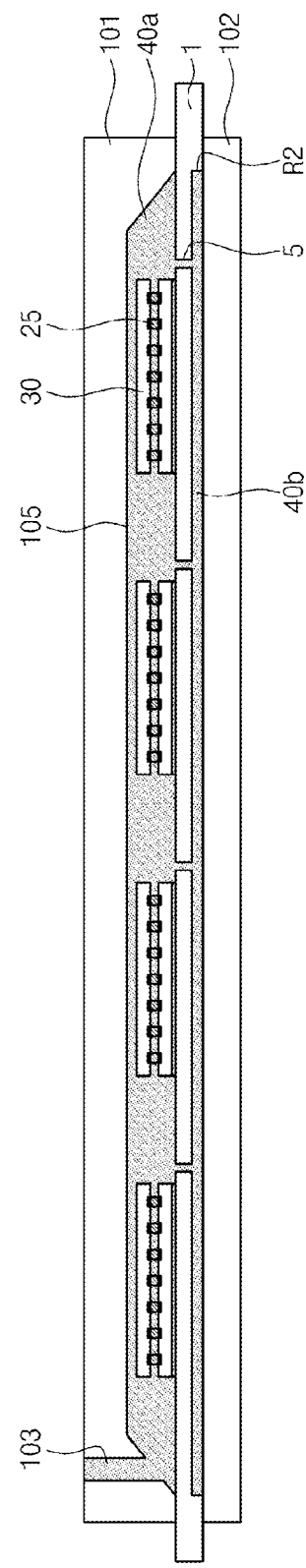

SEMICONDUCTOR PACKAGES AND METHODS OF FORMING THE SAME

CROSS-REFERENCE TO RELATED APPLICATIONS

This U.S. non-provisional patent application claims priority under 35 U.S.C. §119 to Korean Patent Application No. 10-2012-0073430, filed on Jul. 5, 2012, the entirety of which is incorporated by reference herein.

BACKGROUND

The inventive concept relates to semiconductor packages and methods of forming the same.

A chip-on-chip (COC) structure has been receiving much attention due to its ability to achieve high performance, high speed and/or small size of electronic elements for the electronic industry. The COC structure has a plurality of semiconductor chips stacked on one package substrate. In the COC structure, the plurality of semiconductor chips may be mounted on the one package substrate by a flip chip bonding method. Voids may exist between bumps disposed between the semiconductor chips of a semiconductor package having the COC structure.

SUMMARY

Embodiments of the inventive concept may provide semiconductor packages having a chip-on-chip (COC) structure without a void between semiconductor chips.

Embodiments of the inventive concept may also provide methods of forming a semiconductor package capable of preventing a void from be formed between semiconductor chips and simplifying a formation process.

In one aspect, a semiconductor package includes: a package substrate including at least one hole; a first semiconductor chip mounted on the package substrate and not overlapped with the at least one hole; a second semiconductor chip mounted on the first semiconductor chip by a flip chip bonding method; and a molding layer on the package substrate. The molding layer include: a first molding portion covering the second semiconductor chip, the first semiconductor chip and the package substrate and filling a space between the first and second semiconductor chips; and a second molding portion connected to the first molding portion through the at least one hole and disposed to be adjacent to a bottom surface of the package substrate.

In some embodiments, a structure of the first semiconductor chip may be the same as that of the second semiconductor chip; and the first semiconductor chip and the second semiconductor chip may be substantially symmetrical to each other with respect to a bump disposed therebetween.

In other embodiments, the first semiconductor chip may be mounted on the package substrate by a wire bonding method; the first semiconductor chip may include a first bonding pad in contact with the bump and a second boding pad to which a wire is bonded; and the second semiconductor chip may include a third bonding pad in contact with the bump and a fourth pad electrically insulated from the wire and the bump.

In still other embodiments, the same signal may be transmitted to the first bonding pad and the third bonding pad.

In even other embodiments, the semiconductor package may further include: a plurality of solder balls attached to the bottom surface of the package substrate. The second molding portion may be provided between the solder balls; and the second molding portion may have at least one of a line shape, a mesh shape and a closed loop shape.

In yet other embodiments, a height from the bottom surface of the package substrate to a bottom surface of the second molding portion may be smaller than a height from the bottom surface of the package substrate to a bottom end of the solder ball.

In yet still other embodiments, the semiconductor package may further include: a third semiconductor chip attached on the second semiconductor chip; and a fourth semiconductor chip mounted on the third semiconductor chip by a flip chip bonding method. The first to fourth semiconductor chips may have the same structure.

In further embodiments, a structure of the first semiconductor chip may be different from that of the semiconductor chip; and at least one of the first semiconductor chip and the second semiconductor chip may include a through-via.

In still further embodiments, the second molding portion may have a sidewall aligned with a sidewall of the package substrate.

In even further embodiments, the second semiconductor chip may have a width equal to or wider than that of the first semiconductor chip.

In yet further embodiments, a sidewall of the second semiconductor chip may be aligned with a sidewall of the first semiconductor chip.

In yet further embodiments, the first semiconductor chip may be attached to the package substrate with an adhesive layer therebetween.

In yet further embodiments, the second molding portion may cover the bottom surface of the package substrate; and a bottom surface of the second molding portion may protrude from the bottom surface of the package substrate.

In yet further embodiments, the package substrate may include a recessed region overlapped with the at least one hole in the bottom surface thereof; and the second molding portion may be disposed in the recessed region. In this case, a bottom surface of the second molding portion may be substantially coplanar with the bottom surface of package substrate.

In another aspect, a method of forming a semiconductor package include: mounting a first semiconductor chip on a package substrate including at least one hole, the first semiconductor chip not overlapped with the at least one hole; mounting a second semiconductor chip on the first semiconductor chip by a flip chip bonding method; and forming a molding layer on the package substrate. The molding layer includes: a first molding portion covering the first and second semiconductor chips and the package substrate; and a second molding portion connected to the first molding portion through the at least one hole and adjacent to a bottom surface of the package substrate.

In some embodiments, forming the molding layer may include: inserting the package substrate between a lower mold and an upper mold. At least one recessed region may be formed in the lower mold; and the at least one recessed region may be overlapped with the at least one hole.

In other embodiments, the at least one recessed region may have at least one of a line shape, a mesh shape and a closed loop shape.

In still other embodiments, the method may further include: cutting the first molding portion and the package substrate to separate unit semiconductor packages from each other; and attaching solder balls to the bottom surface of the package substrate which is not covered by the second molding portion.

In even other embodiments, mounting the first semiconductor chip may include: attaching the first semiconductor chip on the package substrate to expose the at least one hole; and connecting a bonding pad of the first semiconductor chip to the package substrate with a wire.

In still other embodiments, the package substrate may further include at least one recessed region adjacent to the bottom surface of the package substrate and overlapped with the at least one hole; forming the molding layer may include: inserting the package substrate between a lower mold and an upper mold; and an inner bottom surface of the lower mold overlapped with the at least one hole may be substantially flat.

In some embodiments, a method of forming a semiconductor package using a mold including a lower mold and an upper mold, the method comprising: providing a package substrate with a stack of first and second semiconductor chips mounted thereon in a concave region between the lower and upper mold, the package substrate including at least one hole extending therethrough; and supplying a resin solution into the concave region and through the at least one hole of the package substrate to form a molding layer on the package substrate, the molding layer covering the first and second semiconductor chips. Also, supplying the resin solution may includes exhausting air through the at least one hole of the package substrate.

BRIEF DESCRIPTION OF THE DRAWINGS

The inventive concept will become more apparent in view of the attached drawings and accompanying detailed description.

FIGS. 3A to 6A are cross-sectional views illustrating a method of forming a semiconductor package having a cross section of FIG. 2A;

FIGS. 3B to 6B are cross-sectional views illustrating a method of forming a semiconductor package having a cross section of FIG. 2B;

FIGS. 8A and 8B are cross-sectional views taken along lines C-C' and D-D' of FIG. 7 according to a first embodiment of the inventive concept, respectively;

FIGS. 10A and 10B are cross-sectional views taken along lines C-C' and D-D' of FIG. 7 according to a second embodiment of the inventive concept, respectively;

DETAILED DESCRIPTION OF THE EMBODIMENTS

Figure 1A:
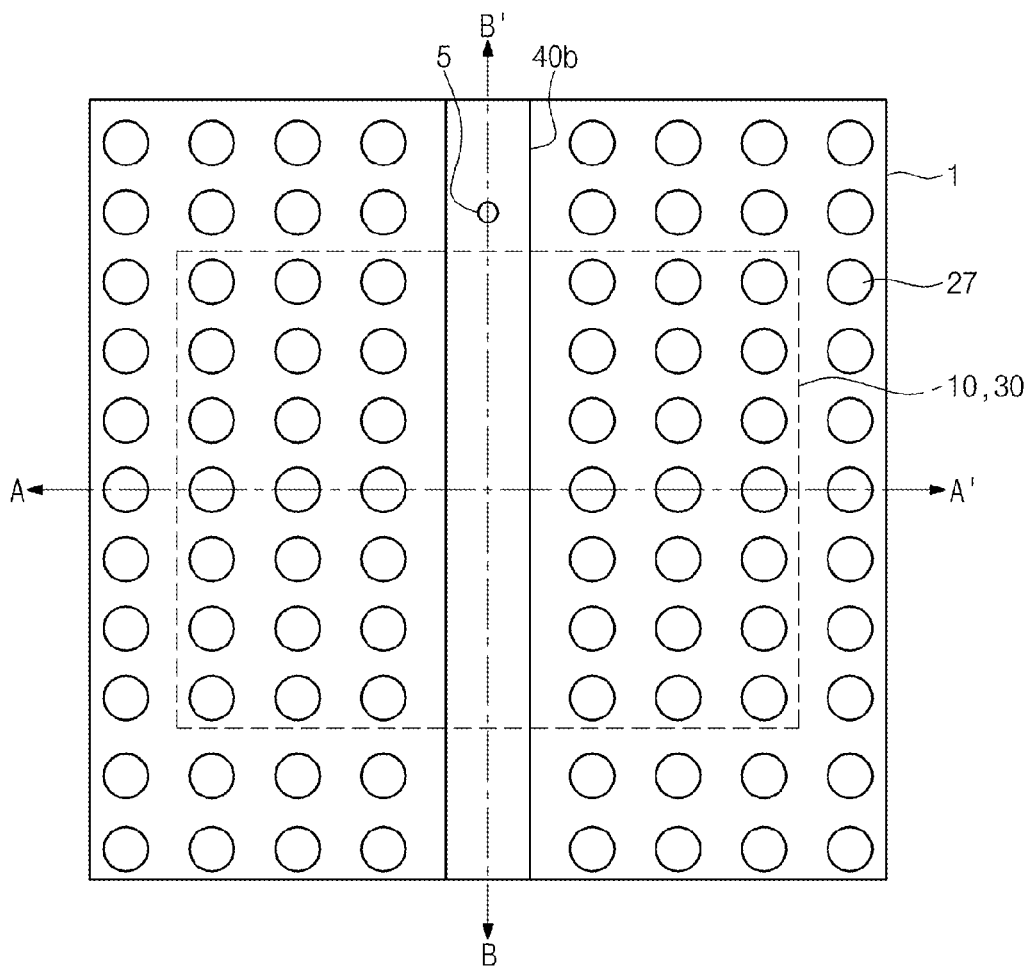
FIG. 1A is a plan view illustrating a bottom surface of a package substrate according to a first embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

Figure 1B:
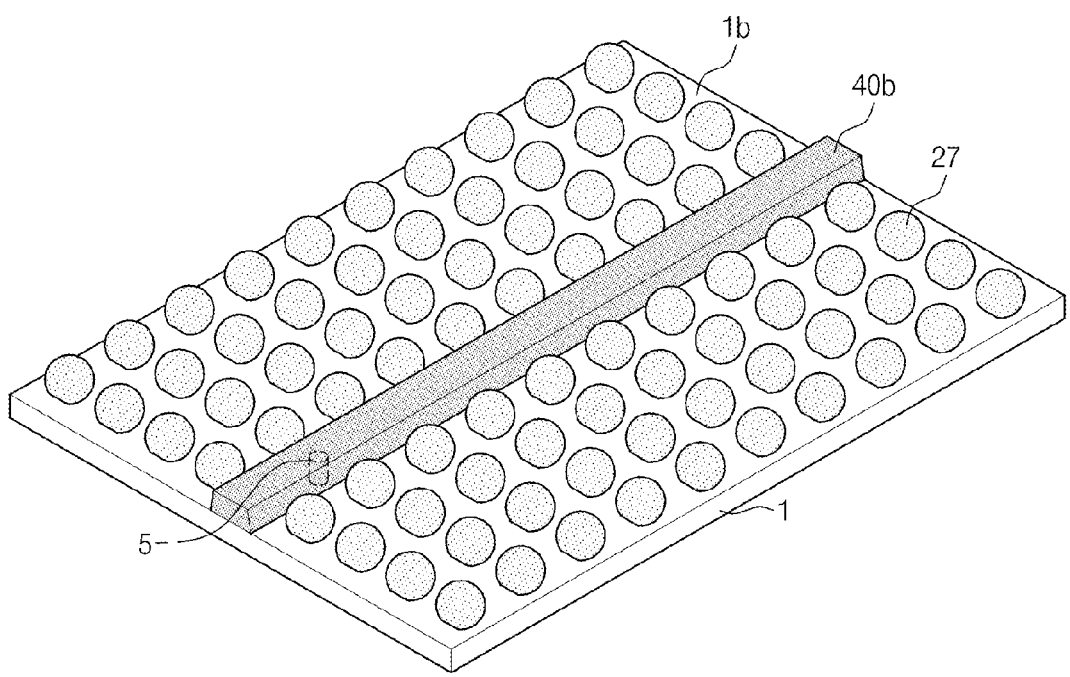
FIG. 1B is a perspective view illustrating a bottom surface of an overturned package substrate according to a first embodiment of the inventive concept.
Figure 1C:
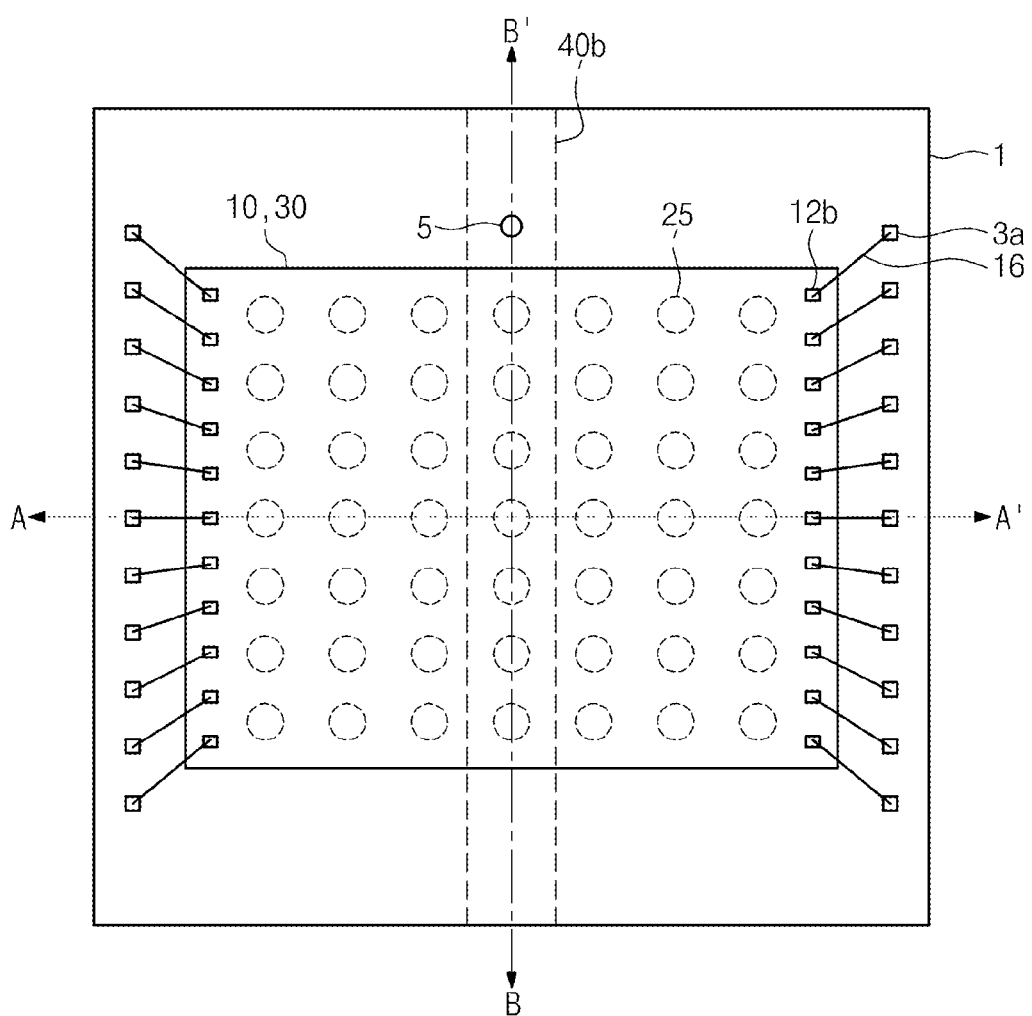
FIG. 1C is a plan view illustrating a top surface of a package substrate according to a first embodiment of the inventive concept.
Figure 2A:
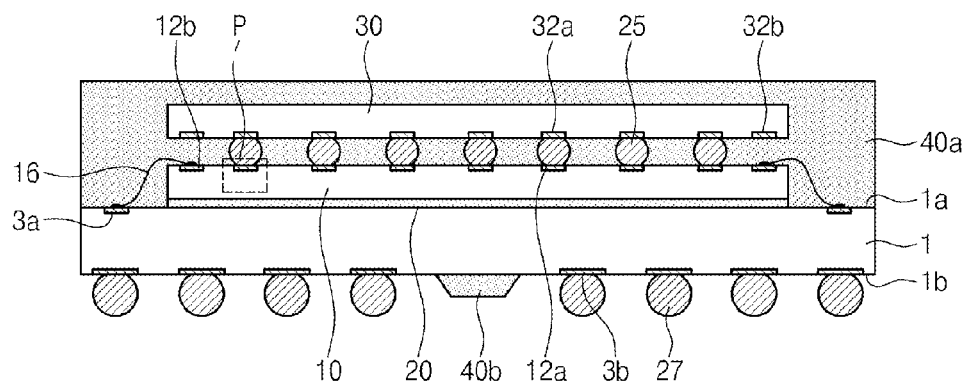
FIGS. 2A and 2B are cross-sectional views respectively taken along lines A-A' and B-B' of FIG. 1A or 1C to explain a semiconductor package according to a first embodiment of the inventive concept.
Figure 2B:
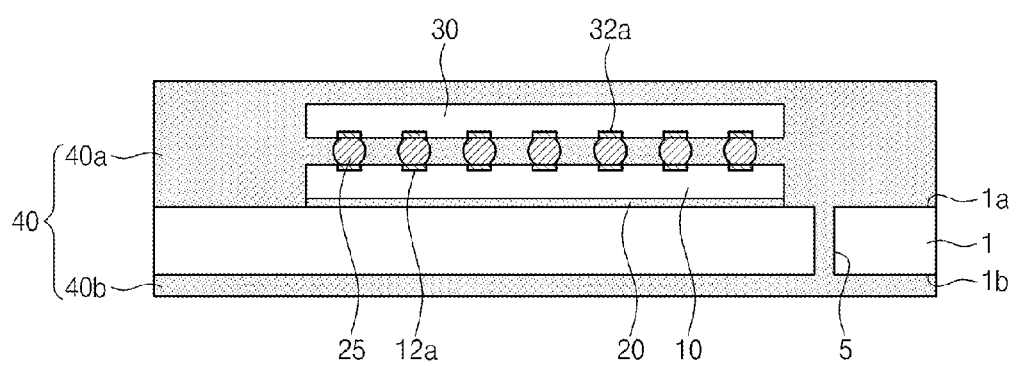

FIG. 1A is a plan view illustrating a bottom surface of a package substrate according to a first embodiment of the inventive concept. FIG. 1B is a perspective view illustrating a bottom surface of an overturned package substrate according to a first embodiment of the inventive concept. FIG. 1C is a plan view illustrating a top surface of a package substrate according to a first embodiment of the inventive concept. FIGS. 2A and 2B are cross-sectional views respectively taken along lines A-A' and B-B' of FIG. 1A or 1C to explain a semiconductor package according to a first embodiment of the inventive concept.

Referring to FIGS. 1A, 1B, 1C, 2A and 2B, a semiconductor package according to the first embodiment includes a package substrate 1. The package substrate 1 may be a printed circuit board comprised of a single layer or a plurality of layers. The package substrate 1 includes a top surface 1a and a bottom surface 1b opposite to each other. The package substrate also includes a hole 5 penetrating the package substrate 1 and extending from the top surface 1a to the bottom surface 1b. First conductive patterns 3a are disposed on the top surface 1a of the package substrate 1 and second conductive patterns 3b are disposed on the bottom surface 1b of the package substrate 1. The second conductive patterns 3b may be ball-lands. A first semiconductor chip 10 is mounted on the top surface 1a of the package substrate 1. The first semiconductor chip 10 may be attached to the top surface 1a with an adhesive layer 20 therebetween. The first semiconductor chip 10 includes first bonding pads 12a and second bonding pads 12b.

Figure 2C:
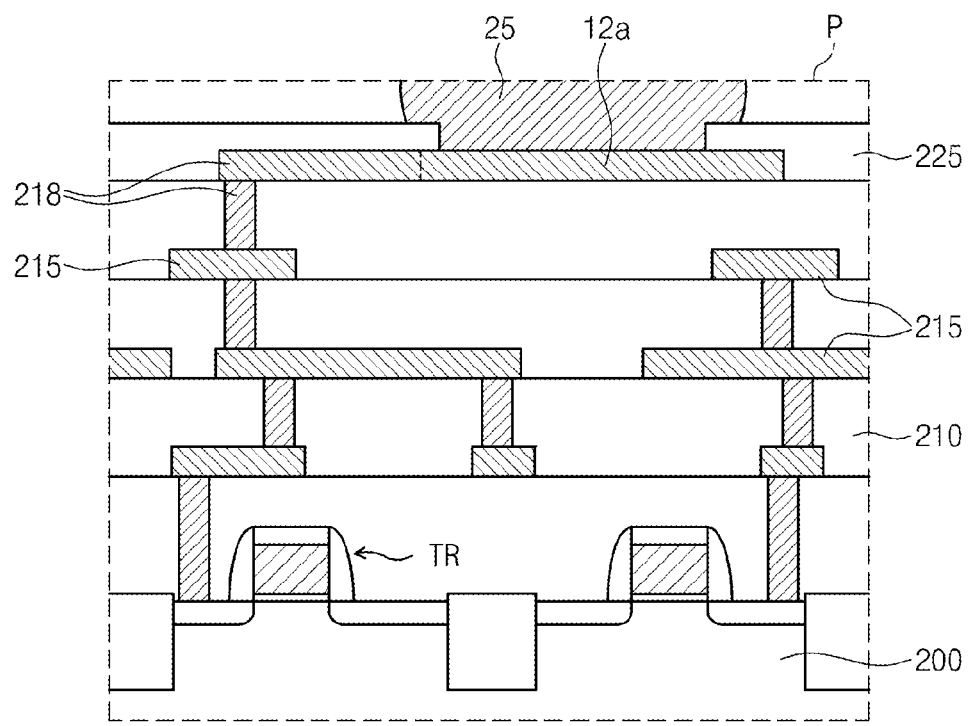
FIG. 2C is an enlarged view of a portion 'P' of FIG. 2A.

FIG. 2C is an enlarged view of a portion 'P' indicated by a dotted line in FIG. 2A.

Referring to FIGS. 2A, 2B and 2C, a plurality of transistors TR are disposed on a semiconductor substrate 200 and the plurality of transistors TR are electrically connected to interconnections 215 within the first semiconductor chip 10. The transistors TR may include non-memory or memory gate electrodes or may further include data storage elements such as a capacitor. Interlayer insulating layers 210 cover the interconnections 215 and the transistors TR. The uppermost interconnection of the interconnections 215 are electrically connected to the first bonding pads 12a and the second bonding pads 12b, for example, by redistribution interconnections 218. Portions of the redistribution interconnections 218, the first bonding pads 12a and the second bonding pads 12b may be covered by a passivation layer 225. Conductive bumps 25 are disposed on the first bonding pads 12a, respectively.

Referring to FIGS. 1A, 1B, 1C, 2A and 2B again, the first semiconductor chip 10 may be connected to the package substrate 1 by a wire bonding method. The second boding pads 12b of the first semiconductor chip 10 are connected to the first conductive patterns 3a of the package substrate 1 by wires 16. The second bonding pads 12b may be signal transmission paths connected to an external device. A second semiconductor chip 30 may be mounted on the first semiconductor chip 10 by a flip-chip bonding method. In the present embodiment, a structure of the second semiconductor chip 30 may be the same as that of the first semiconductor chip 10. For example, the first and second semiconductor chips 10 and 30 may both be memory chips. The second semiconductor chip 30 may include third bonding pads 32a and fourth bonding pads 32b. The third bonding pads 32a may be in contact with the conductive bumps 25, respectively. The first and second semiconductor chips 10 and 30 may be substantially symmetrical to each other with respect to the conductive bumps 25. The fourth bonding pads 32b may be electrically insulated from the conductive bumps 25 and the wires 16. Positions of the third bonding pads 32a may correspond to positions of the first bonding pads 12a, respectively. The same signal may be applied to the third bonding pad 32a and the first bonding pad 12a positioned to face each other. In other words, the first and third bonding pads 12a and 32a performing the same function may be connected to each other through the conductive bump 25. The external device may access the second semiconductor chip 30 through the first semiconductor chip 10. Since the first and second semiconductor chips 10 and 30 are the same kind of memory chips and may face each other by the flip chip bonding method, the memory capacity of the semiconductor package may increase by two times and a signal transmission speed of the semiconductor package may be improved. The package structure may be very suitable for a next generation memory product converted into a double data rate 4 (DDR4) type.

Since the first and second semiconductor chips 10 and 30 are the same chips, the first and second semiconductor chips 10 and 30 may have the same size (e.g., the same width, the same thickness and the same area). Sidewalls of the first and second semiconductor chips 10 and 30 may therefore be aligned with each other. The first and second semiconductor chips 10 and 30 may not overlap the hole 5. A molding layer 40 may be disposed on the top and bottom surfaces of the package substrate 1. The molding layer 40 may include a first molding portion 40a and a second molding portion 40b. The first molding portion 40a may cover the first and second semiconductor chips 10 and 30 and the top surface 1a of the package substrate 1. The first molding portion 40a extends to fill a space between the bumps 25 disposed between the first and second semiconductor chips 10 and 30. The second molding portion 40b is connected to the first molding portion 40a through the hole 5 and covers the bottom surface 1b of the package substrate 1. The first molding portion 40a and the second molding portion 40b may be connected to each other without an interface, so as to constitute a single body. The first and second portions 40a and 40b may be formed of the same material. The molding layer 40 may include a resin layer and a plurality of filler particles dispersed into the resin layer. The resin layer may include at least one polymer material. The filler particles may include a material such as silica or alumina.

In the present first embodiment, the second molding portion 40b may have a line shape crossing a center of the bottom surface 1b in plan view. A bottom surface of the second molding portion 40b protrudes from the bottom surface 1b of the package substrate 1. Solder balls 27 may be disposed on the second conductive patterns 3b, respectively. (See FIG. 2A) A distance between the bottom surface 1b of the package substrate 1 and the bottom surface of the second molding portion 40b may be smaller than a height of each of the solder balls 27. In other words, the bottom surface of the second molding portion 40b may be lower than a bottom end of the solder ball 27 with respect to the bottom surface 1b of the package substrate 1. The solder balls 27 may be spaced apart from the second molding portion 40b.

In the structure according to the present first embodiment, the space between the first and second semiconductor chips 10 and 30 may be filled with only the first molding portion 40a without an underfill resin layer. Additionally, a void may not be formed between the first and second semiconductor chips 10 and 30. Thus, the semiconductor package according to the present embodiment does not need the underfill resin layer. As a result, a formation process of the semiconductor package may be simplified.

FIGS. 3A to 6A are cross-sectional views illustrating a method of forming a semiconductor package, the semiconductor package illustrated in FIGS. 3A to 6A having a cross section of FIG. 2A. FIGS. 3B to 6B are cross-sectional views illustrating a method of forming a semiconductor package having a cross section of FIG. 2B.

Figure 3A:
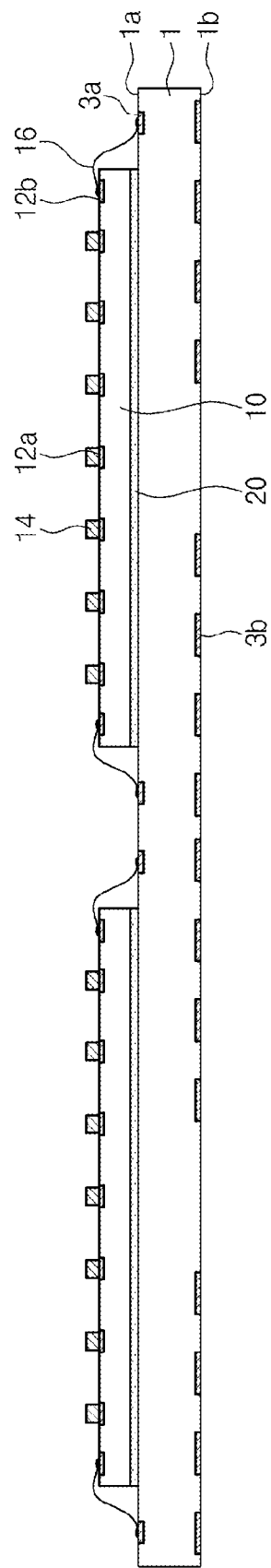
Figure 3B:
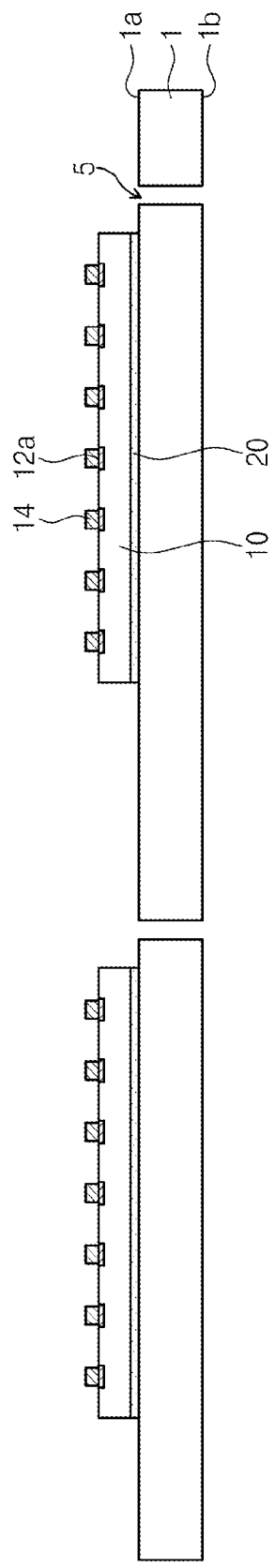

Referring to FIGS. 3A and 3B, a package substrate 1 is prepared. The package substrate 1 includes a top surface 1a and a bottom surface 1b opposite to each other, first conductive patterns 3a disposed on the top surface 1a and second conductive patterns 3b disposed on the bottom surface 1b. A hole 5 is formed in the package substrate 1 including the top and bottom surfaces 1a and 1b and the first and second conductive patterns 3a and 3b. The hole 5 connects the top surface 1a with the bottom surface 1b. For example, the hole 5 may be formed using a laser or other suitable methods within the spirit and scope of the present disclosure. The hole 5 may be formed outside regions on which semiconductor chips are mounted. First semiconductor chips 10 are attached to the top surface 1a of the package substrate 1, for example, with an adhesive layer 20 therebetween. The adhesive layer 20 may be a double-sided tape or an adhesive. Each of the first semiconductor chips 10 includes first bonding pads 12a and second boding pads 12b. The second bonding pads 12b may be disposed adjacent to an edge of the first semiconductor chip 10. First conductive bumps 14 may be disposed on the first bonding pads 12a, respectively. When the first semiconductor chips 10 are attached to the top surface 1a, the bonding pads 12a and 12b may face upward. The second bonding pads 12b may be connected to the first conductive patterns 3a by wires 16. Alternatively, the second bonding pads 12b may be connected to the first conductive patterns 3a by other suitable methods.

Referring to FIGS. 4A and 4B, a second semiconductor chip 30 is disposed on each of the first semiconductor chip 10. The second semiconductor chip 30 includes third bonding pads 32a and fourth bonding pads 32b. Second bumps 34 are disposed on the third bonding pads 32a, respectively. The second bumps 34 respectively correspond to the first bumps 14, respectively. The second semiconductor chip 30 may have the same structure and the same size as the first semiconductor chip 10. Thus, the first bonding pad 12a may have the same structure as the third bonding pad 32a and the second bonding pad 12b may have the same structure as the fourth bonding pad 32b. The first bump 14 may be the same as the second bump 34. The first and second bumps 14 and 34 may be formed of a conductive material such as tin and/or lead.

Referring to FIGS. 5A and 5B, a heat is applied to the first and second bumps 14 and 34 being in contact with each other while supplying a flux agent thereto. Thus, the first and second bumps 14 and 34 may be melted and bonded to each other, so that a single bump 25 may be formed. Even though not shown in the drawings, an additional solder ball or solder particle may be used when the first and second bumps 14 and 34 are melted and bonded to each other. Any bumps or wires may not be connected to the fourth bonding pads 32b.

Figure 6A:
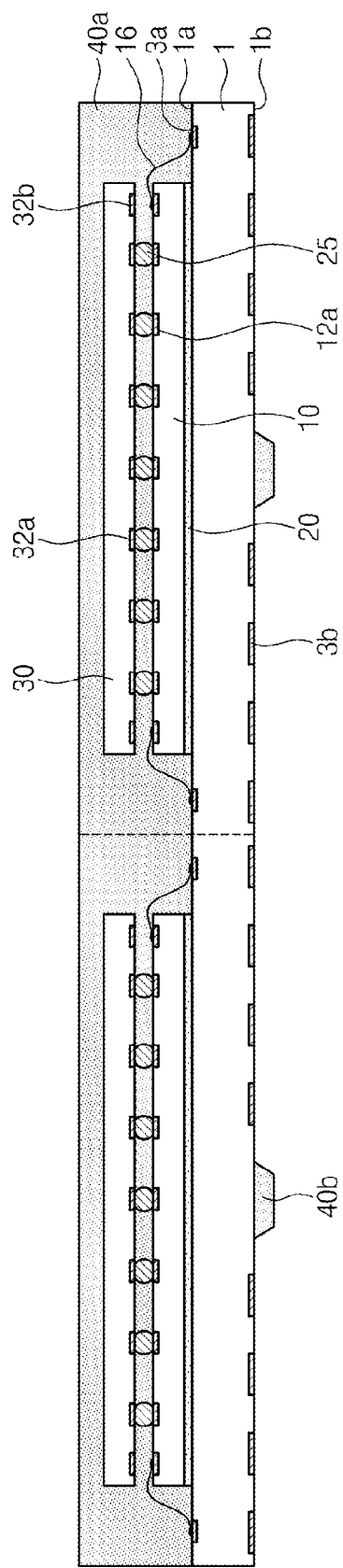
Figure 6B:
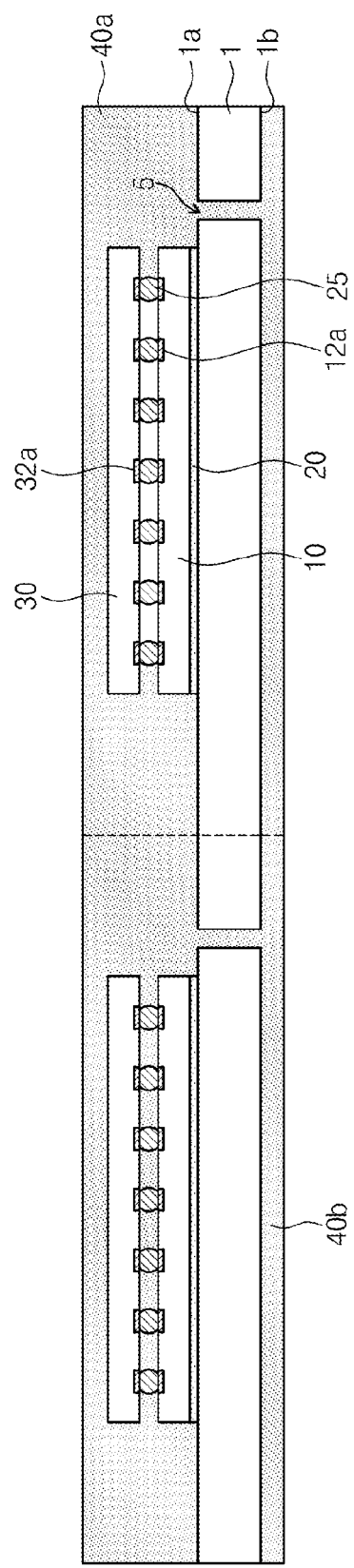

Referring to FIGS. 6A and 6B, a molding process is performed to form a mold layer 40a and 40b. The molding process will be described in more detail.

Figure 7:
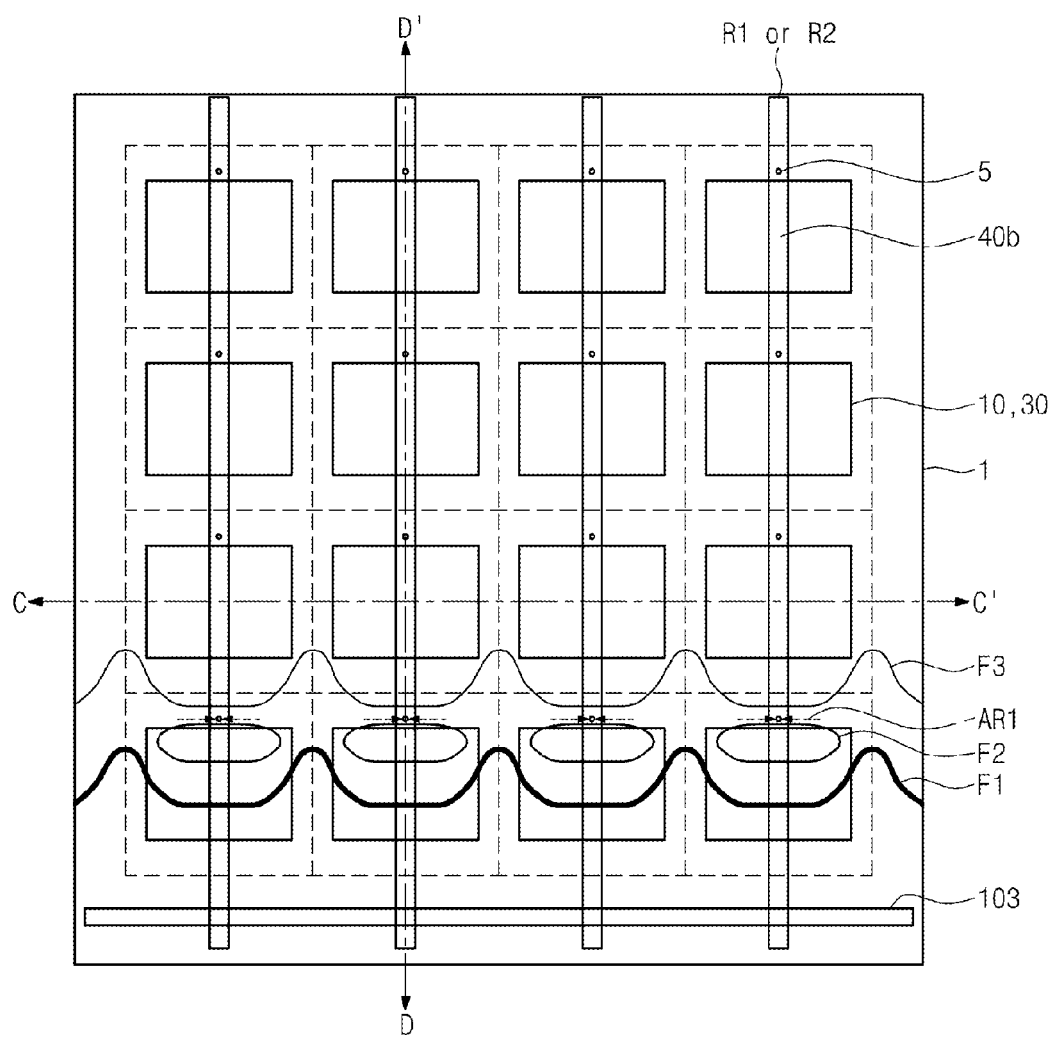
FIG. 7 shows a plan view of a package substrate disposed in a mold and flowing of a resin solution for forming a molding layer.

FIG. 7 shows a plan view of a package substrate disposed in a mold. FIG. 7 illustrates the flow of a resin solution for forming a molding layer. FIGS. 8A and 8B are cross-sectional views taken along lines C-C' and D-D' of FIG. 7 according to a first embodiment of the inventive concept, respectively.

Referring to FIGS. 6A, 6B, 7, 8A and 8B, the package substrate 1 is disposed between a lower mold 102 and an upper mold 101. A plurality of recessed regions R1 may be formed in the lower mold 102. Each of the recessed regions R1 may be overlapped with the hole 5 and defines the shape of the second molding portion 40b. A concave region 105 defining the shape of the first molding portion 40a may be formed in the upper mold 101. Additionally, a resin solution-supplying inlet 103 is formed in the upper mold 101. A resin solution for forming a molding layer is supplied through the resin solution-supplying inlet 103 into the concave region 105. If the supply of the resin solution starts from the resin solution-supplying inlet 103, air between the lower and upper molds 102 and 101 is exhausted through an outlet (not shown) opposite to the resin solution-supplying inlet 103. If the supply of the resin solution starts from the resin solution-supplying inlet 103, the resin solution may flow along reference designators F1, F2 and F3 showing the flow of the resin solution in order. In other words, the resin solution flows rapidly in a space between the first semiconductor chips 10 adjacent to each other in which an obstacle does not exist and the resin solution slowly flows in a space between the first and second semiconductor chips 10 and 30 in which many obstacles exist. The resin solution flowing between the adjacent first semiconductor chips 10 along the reference designator F1 may come to flow along an arrow AR1, so that the flow of the resin solution may become the same as the reference designator F2. If the hole 5 and the recessed region R1 do not exist, air between the first arriving resin solution and the slowly flowing resolution stays within the mold, so that a void may be formed. However, according to some embodiments of the inventive concept, the air may be exhausted through the hole 5, such that the formation of the void, for example, between the semiconductor chips is prevented. Additionally, the first arriving resin solution may be continuously exhausted through the hole 5, so that the flow of the slowly flowing resin solution may not be obstructed by the first arriving resin solution. Thus, it is possible to substantially reduce the formation of the void. Thereafter, the resin solution may flow along the reference designator F3 without the void. As a result, the resin solution may fully fill the concave region 105 and the recessed regions R1 without the void. Subsequently, a hardening process may be performed to convert the resin solution into the molding layer 40*a* and 40*b*. Then the molds 101 and 102 may be removed. Thus, the molding layer 40 may cover the first and second semiconductor chips 10 and 30 and the top surface 1*a* of the package substrate 1. And the molding layer 40 may be formed to include the first molding portion 40*a* and the second molding portion 40*a* at the same time. The first molding portion 40*a* fills the space between the first and second semiconductor chips 10 and 20. The second molding portion 40*b* may be connected to the first molding portion 40*a* and cover a portion of the bottom surface 1*b* of the package substrate 1.

Referring to FIGS. 6A and 6B, a singulation process may be performed to cut the first molding portion 40*a*, the package substrate 1 and the second molding portion 40*b*, so that unit semiconductor packages are separated from each other. Subsequently, referring to FIGS. 2A and 2B again, solder balls 27 may be attached (or melted and bonded) to the second conductive patterns 3*b*, respectively. In other embodiments, the solder ball adhesion process may be performed before the singulation process.

Second Embodiment

Figure 9A:
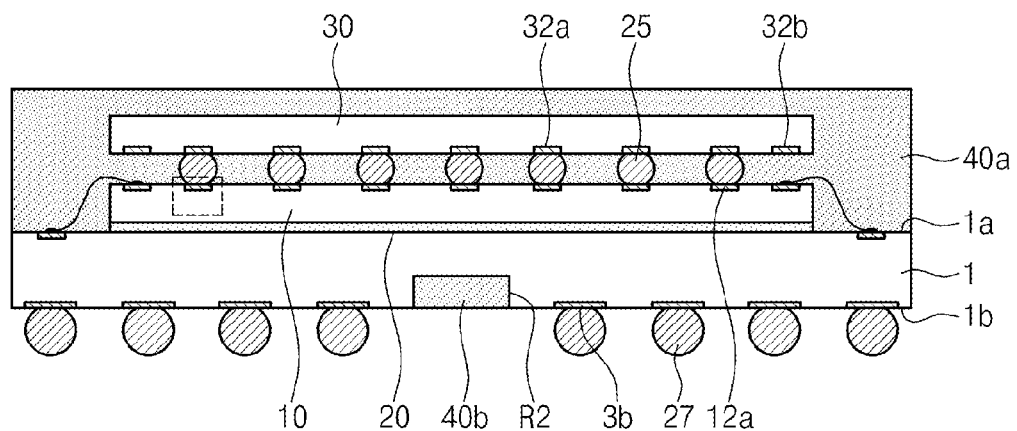
FIGS. 9A and 9B are cross-sectional views respectively taken along lines A-A' and B-B' of FIG. 1A or 1C to explain a semiconductor package according to a second embodiment of the inventive concept.
Figure 9B:
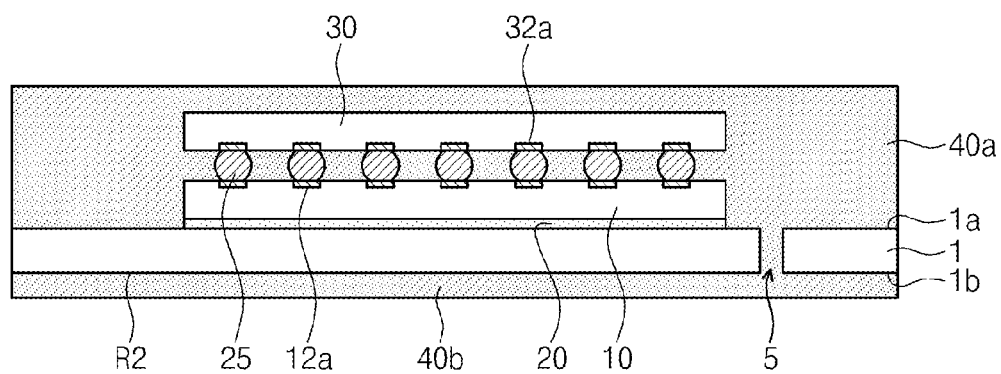
Figure 9C:
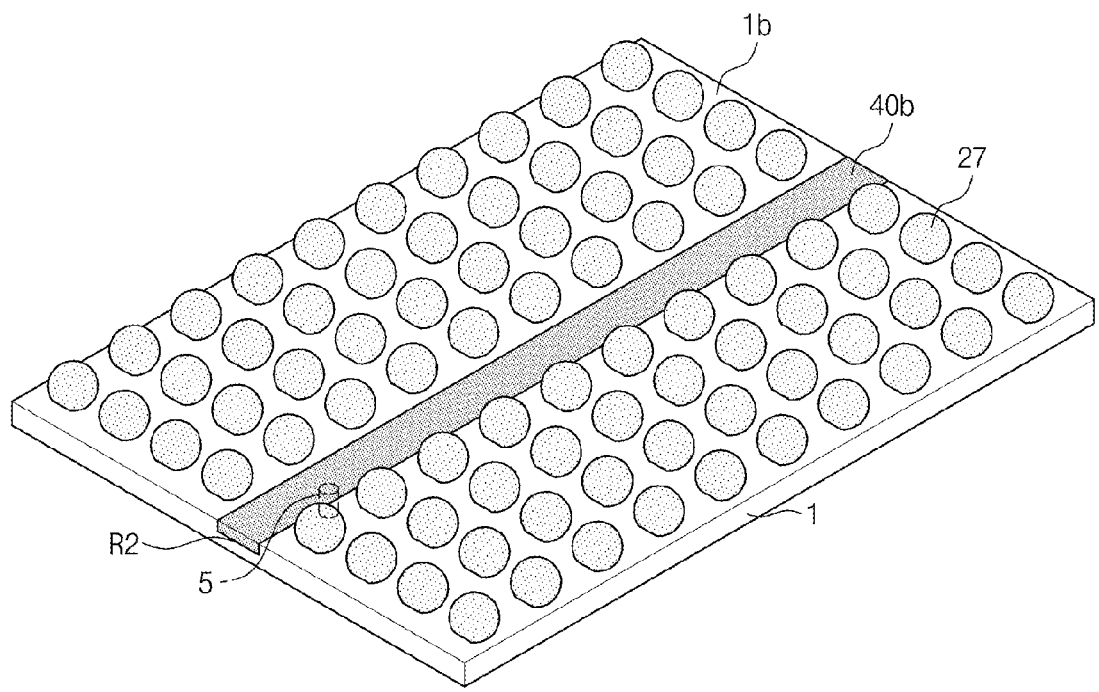
FIG. 9C is a perspective view illustrating a bottom surface of an overturned package substrate according to a second embodiment of the inventive concept.

FIGS. 9A and 9B are cross-sectional views respectively taken along lines A-A' and B-B' of FIG. 1A or 1C to explain a semiconductor package according to a second embodiment of the inventive concept. FIG. 9C is a perspective view illustrating a bottom surface of an overturned package substrate according to a second embodiment of the inventive concept.

Referring to FIGS. 9A, 9B and 9C, a package substrate 1 according to the present embodiment includes a recessed region R2 adjacent to a bottom surface 1*b* and overlapped with a hole 5. The recessed region R2 may have a line shape extending between solder balls 27. The recessed region R2 may be formed on a solder resist layer disposed on the bottom surface of the package substrate 1. Alternatively, the recessed region R2 may be formed in the solder resist layer and an insulating substrate thereunder. A second molding portion 40*b* may be disposed in the recessed region R2 and the hole 5. A bottom surface of the second molding portion 40*b* may be substantially coplanar with the bottom surface 1*b* of the package substrate 1. Since the second molding portion 40*b* is disposed in the recessed region R2 and the bottom surface of the second molding portion 40*b* is substantially coplanar with the bottom surface 1*b* of the package substrate 1, the second molding portion 40*b* may not cover or block the conductive patterns 3*b* functioning as ball lands. Thus, it is possible to reduce an error rate of a process bonding the solder balls 27.

Other elements of the semiconductor package according to the present embodiment may be the same as/similar to the elements of the first embodiments corresponding thereto.

Next, a method of forming the semiconductor package of FIGS. 9A, 9B and 9C will be described with reference to FIGS. 10A and 10B.

FIGS. 10A and 10B are cross-sectional views taken along lines C-C' and D-D' of according to a second embodiment of the inventive concept, respectively.

Referring to FIGS. 10A and 10B, first and second semiconductor chips 10 and 30 may be mounted on a package substrate 1 including recessed regions R2 and holes 5 as described in the first embodiment. Subsequently, the package substrate 1 is disposed between upper and lower molds 101 and 102. An inner bottom surface of the lower mold 102 may be substantially flat. In other words, the inner bottom surface of the lower mold 102 overlapped with the hole 5 may be substantially flat without the recessed region R1 of FIG. 8A. The inner bottom surface of the lower mold 102 is in contact with the bottom surface 1*b* of the package substrate 1. Next, the molding process may be performed as described in the first embodiment, such that the resin solution for forming the molding layer may fill the concave region 105 and fill the recessed regions R2 of the package substrate 1 through the holes 5 without a void. Subsequently, the hardening process, the singulation process and the solder ball adhesion process may be performed to form the semiconductor package of FIGS. 9A, 9B and 9C.

Third Embodiment

Figure 11A:
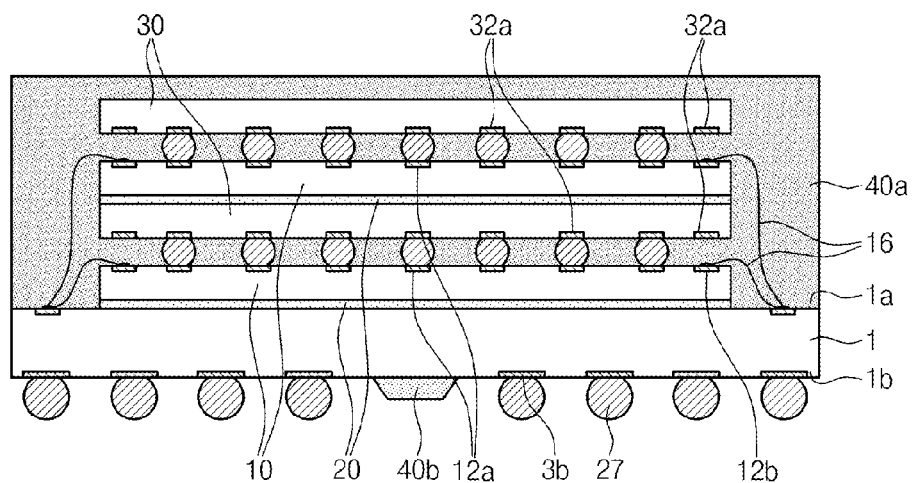
FIGS. 11A and 11B are cross-sectional views respectively taken along lines A-A' and B-B' of FIG. 1A or 1C to explain a semiconductor package according to a third embodiment of the inventive concept.
Figure 11B:
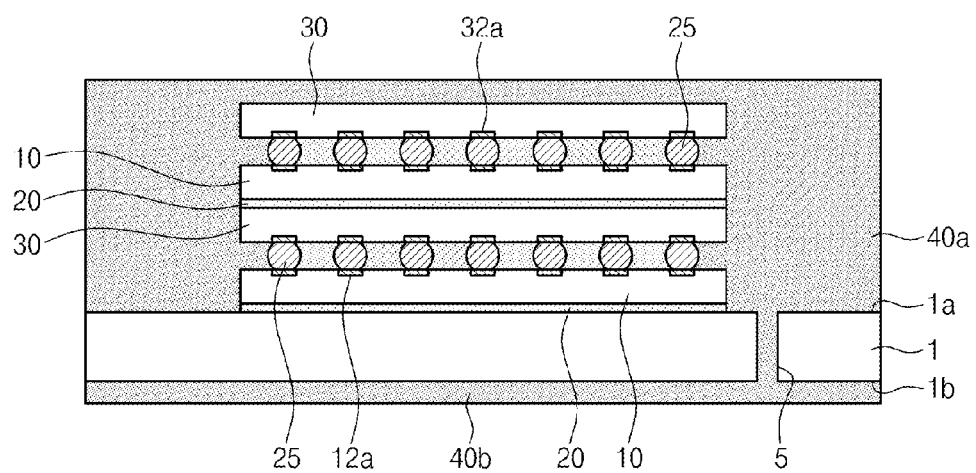

FIGS. 11A and 11B are cross-sectional views respectively taken along lines A-A' and B-B' of FIG. 1A or 1C to explain a semiconductor package according to a third embodiment of the inventive concept.

Referring to FIGS. 11A and 11B, the stacked first and second semiconductor chips 10 and 30 of the first embodiment may constitute stack structures. Two of the stack structures may be stacked in a semiconductor package according to the present third embodiment. In other words, the second semiconductor chip 30 may be mounted on the first semiconductor chip 10, for example, by a flip chip bonding method. An additional first semiconductor chip 10 may be bonded on the second semiconductor chip 30 with an adhesive layer 20. An additional second semiconductor chip 30 may be mounted on the additional first semiconductor chip 10, e.g., by a flip chip bonding method. All of the first semiconductor chips 10 may be mounted on the package substrate 1 by a wire bonding method. The first semiconductor chips 10 and the second semiconductor chips 30 in the semiconductor package may be the same type chips, e.g., memory chips. The structure of the semiconductor package according to the present third embodiment may be applied to a next generation product capable of increasing the memory capacity by fourth times and improving an operation speed. Other elements of the semiconductor package according to the present third embodiment may be the same as/similar to the elements of the first embodiments corresponding thereto.

FIGS. 12A to 12I are plan views of bottom surfaces of the package substrates according to modified examples of the inventive concept.

Figure 12A:
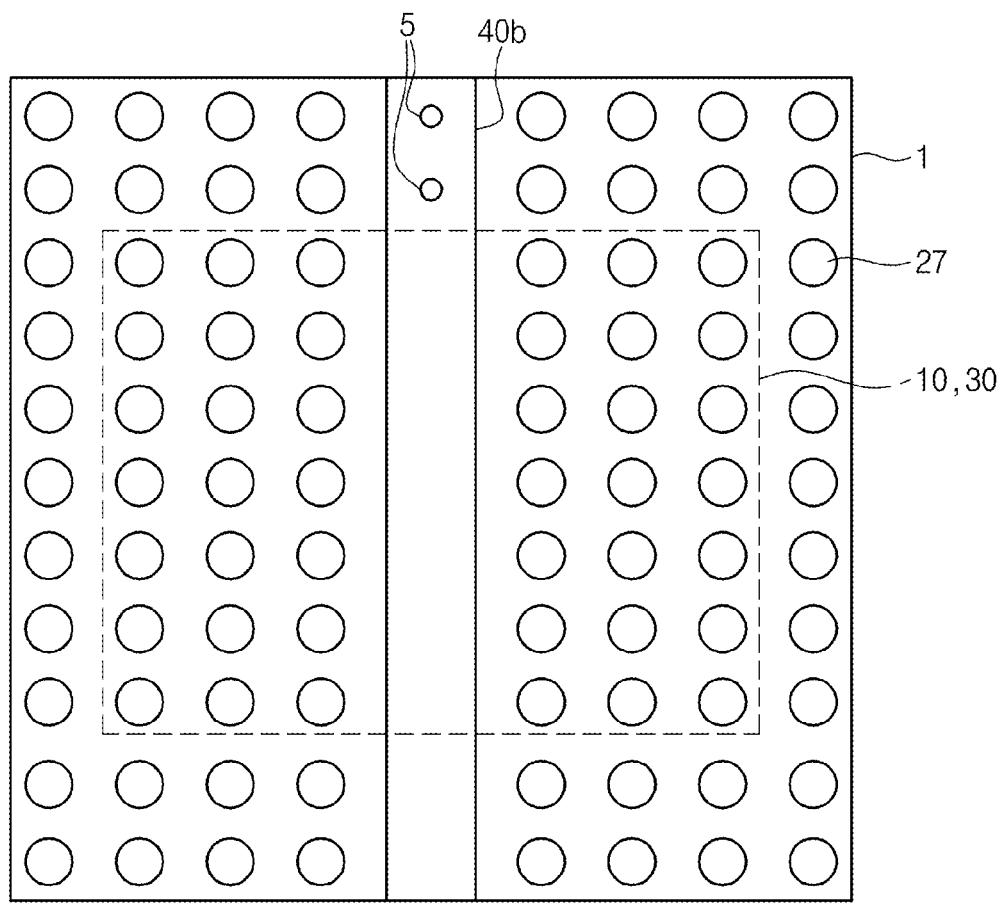
FIGS. 12A to 12I are plan views of bottom surfaces of the package substrates according to modified examples of the inventive concept.
Figure 12B:
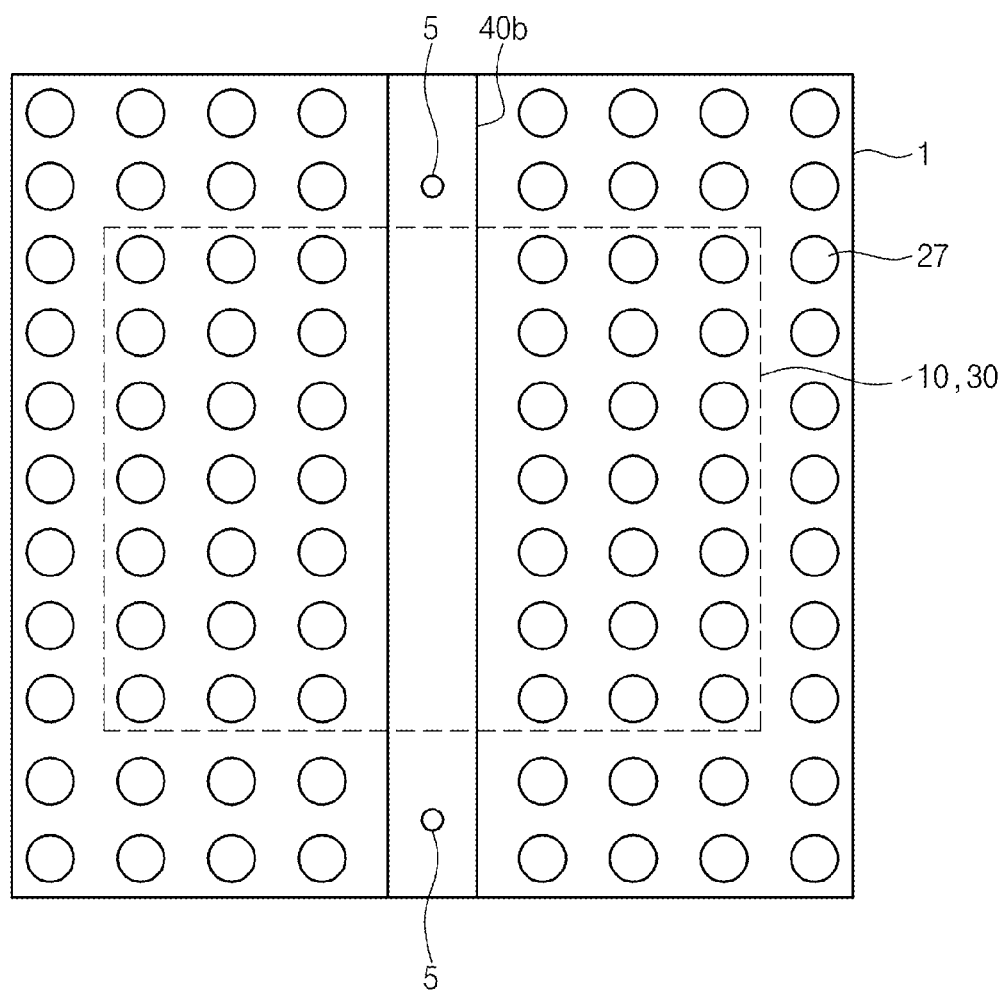
Figure 12C:
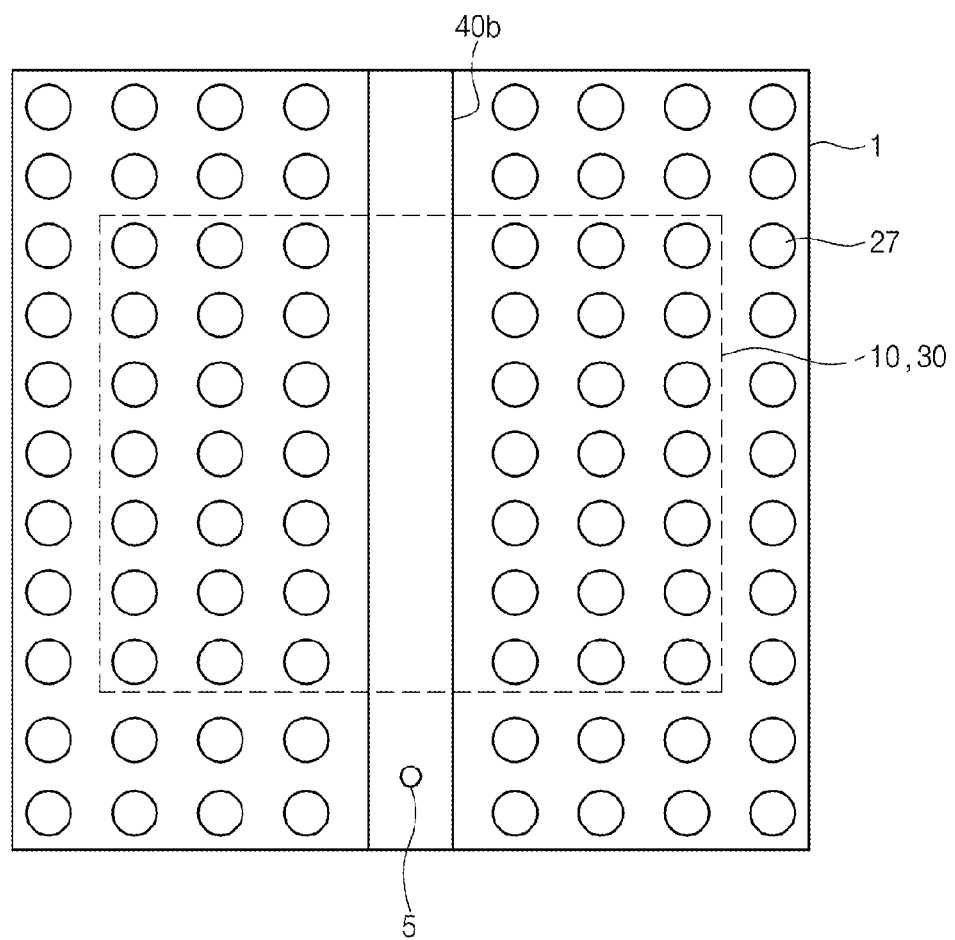

Referring to FIG. 12A, two holes 5 may be disposed to be adjacent to one of the sidewalls of the semiconductor chips 10 and 30 in the package substrate 1. In other embodiments, as illustrated in FIG. 12B, each of two holes 5 may be disposed adjacent to a corresponding one of sidewalls of the semiconductor chip 10 or 30, respectively. In still other embodiments, as illustrated in FIG. 12C, one hole 5 may be disposed to be adjacent to a sidewall of the semiconductor chip 10 or 30 opposite to the sidewall of the semiconductor chip 10 or 30 adjacent to the hole 5 of the first embodiment. The second molding portion 40*b* having a line shape may be disposed on the bottom surface of the package substrate 1 in FIGS. 12A to 12C.

Figure 12D:
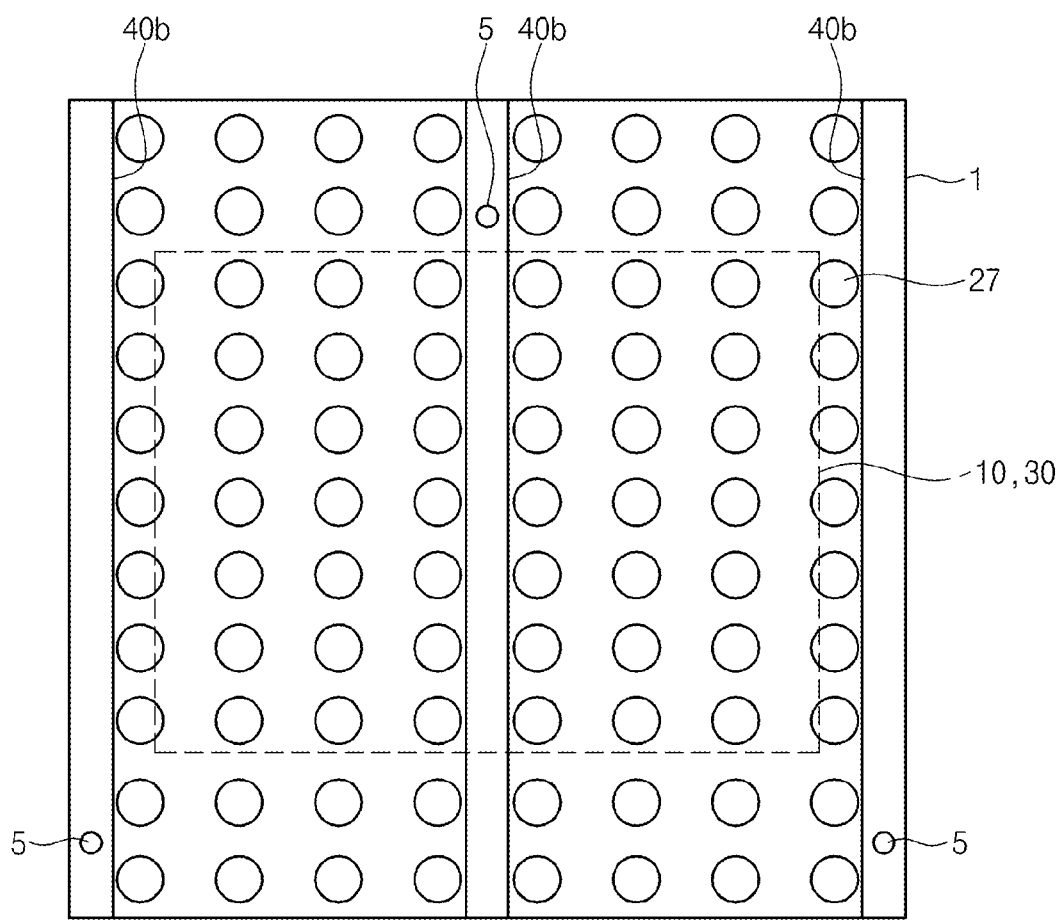

Referring to FIG. 12D, a second molding portion 40*b* may include three line parts parallel to each other and spaced apart from each other. One of the three line parts of the second molding portion 40b extends over a center of the bottom surface of the package substrate 1 as described in the first embodiment and the other two line parts may be disposed on both edge regions of the bottom surface of the package substrate 1, respectively. Holes 5 overlap the line parts of the second molding portion 40b, respectively. The hole 5 overlapped with the line part of the second molding portion 40b disposed on the center of the bottom surface of the package substrate 1 may be disposed at the same position as the hole 5 in the first embodiment. The holes 5 overlapped with the line parts of the second molding portion 40b disposed on both edge regions of the bottom surface of the package substrate 1 may be disposed to be respectively adjacent to corners of the package substrate 1 opposite to the position of the hole 5 of the first embodiment.

Figure 12E:
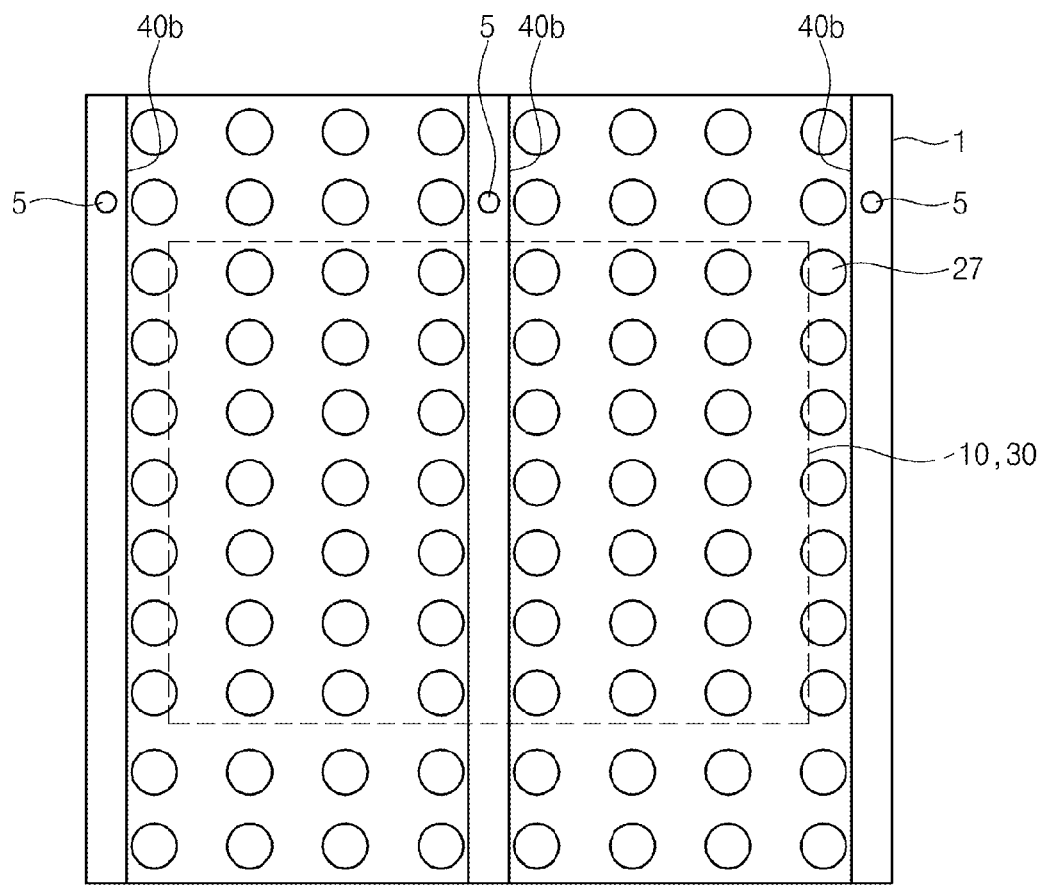

Referring to FIG. 12E, the second molding portion 40b includes three line parts as illustrated in FIG. 12D. However, holes 5 may be disposed at a substantially equal distance from one sidewall of the package substrate 1.

Figure 12F:
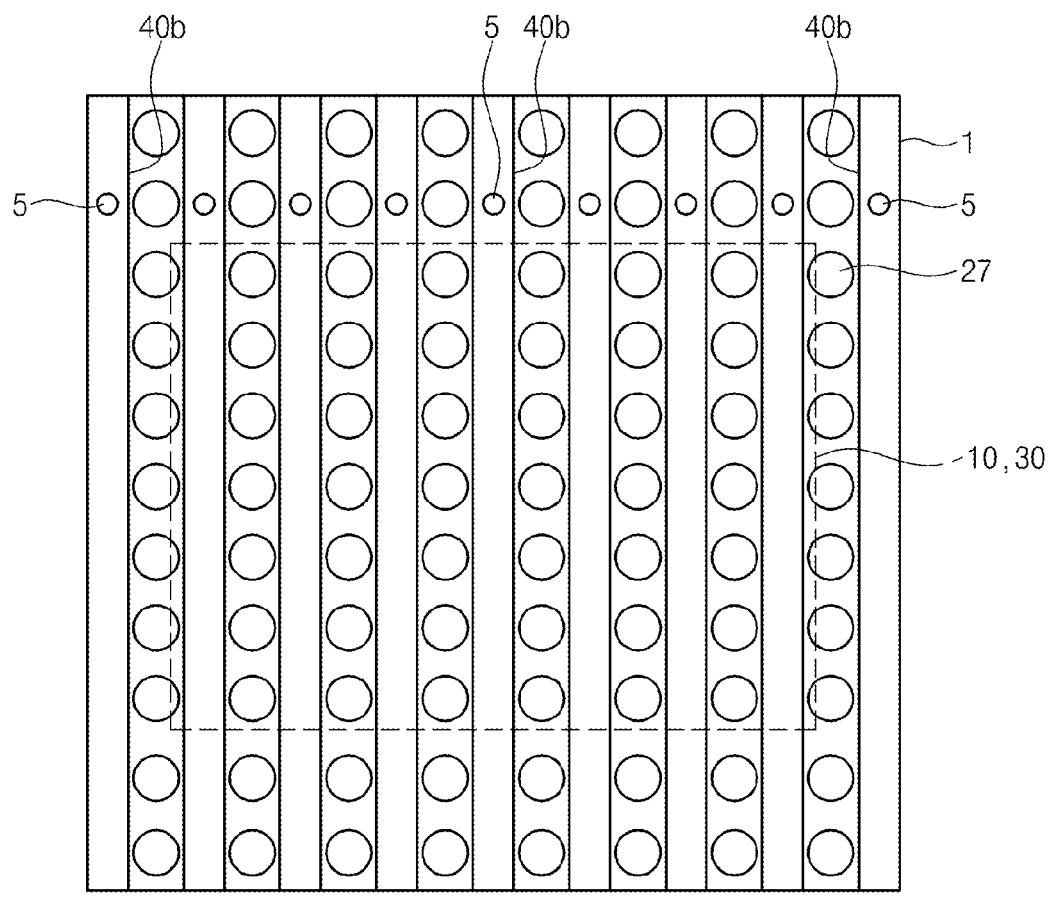

Referring to FIG. 12F, a second molding portion 40b may include more than three, e.g., nine line parts parallel to each other. The nine line parts of the second molding portion 40b may be disposed between the solder balls 27 and spaced apart from each other. The nine line parts of the second molding portions 40b overlap holes 5, respectively. The holes 5 may be disposed at a substantially equal distance from one sidewall of the package substrate 1.

Figure 12G:
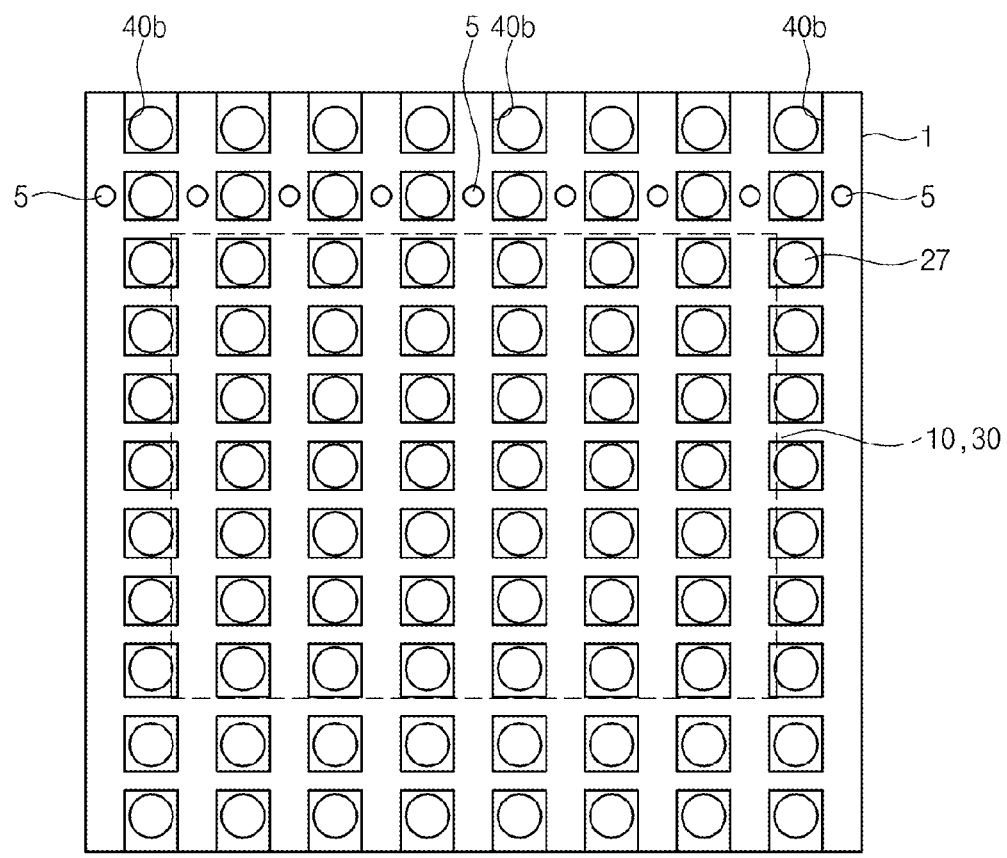

Referring to FIG. 12G, a second molding portion 40b may have a mesh shape isolating the solder balls 27 from each other. In this case, since the second molding portion 40b may surround each of the solder balls 27, it is possible to substantially reduce a short between the solder balls 27 which may be caused by melting of the solder balls 27 in a reflow process for mounting the package substrate 1 on a mother board.

Figure 12H:
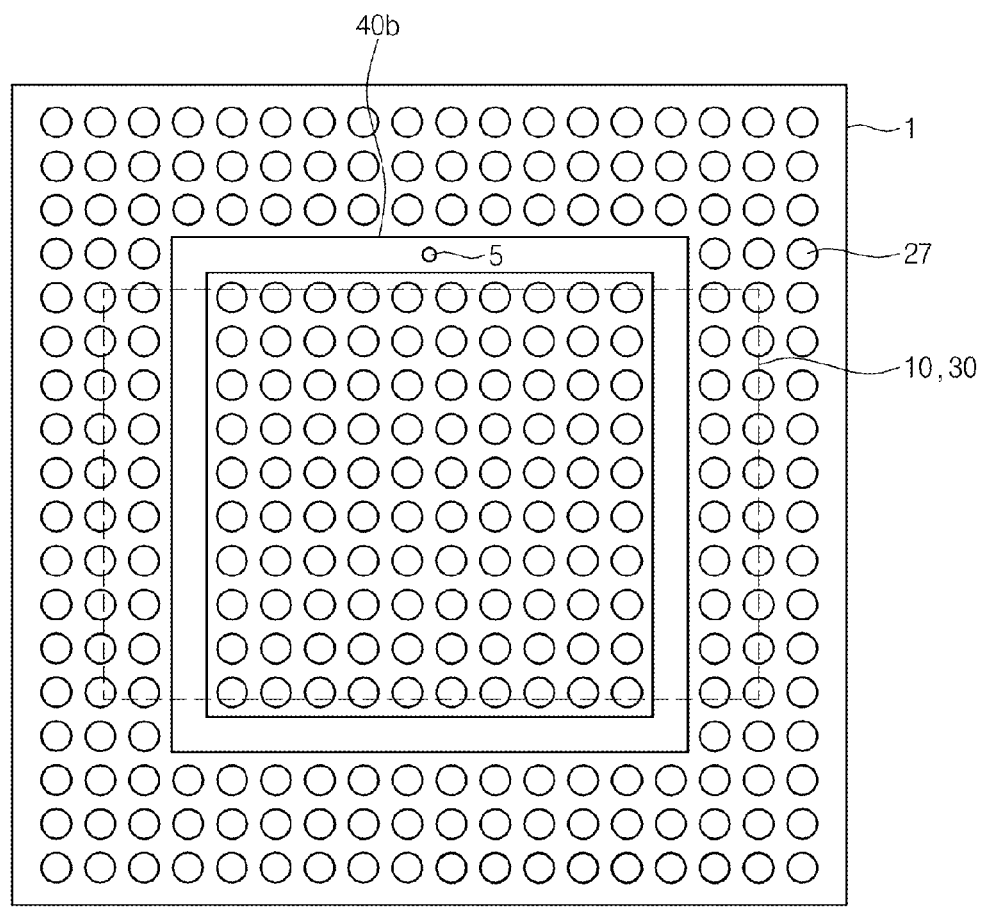

Referring to FIG. 12H, the second molding portion 40b may have a closed loop shape.

Figure 12I:
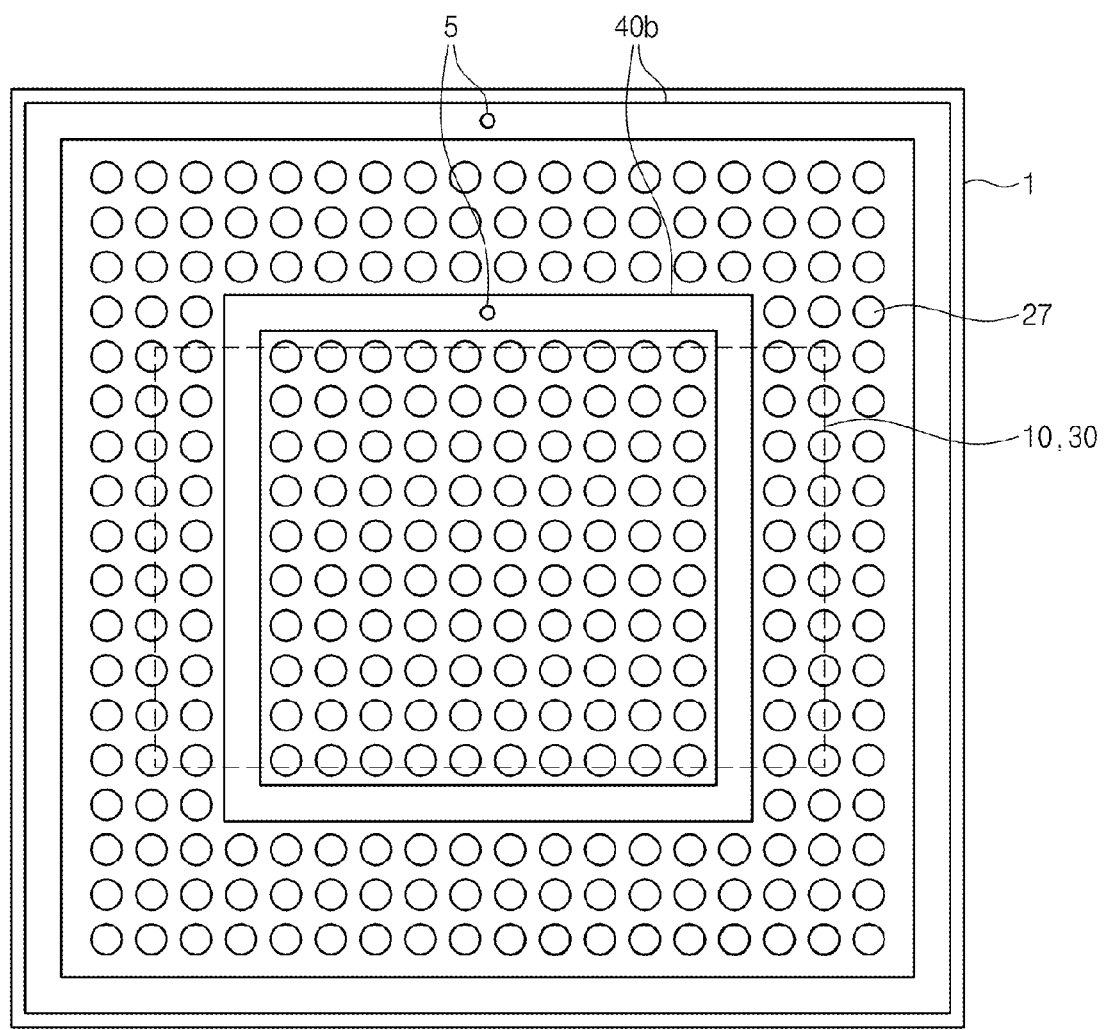

Referring to FIG. 12I, the second molding portion 40b may have another closed loop shape disposed along edges of the package substrate 1 in addition to the closed loop shape shown in FIG. 12H disposed within another closed loop shape.

The second molding portions 40b described with reference to FIGS. 12A to 12H may be disposed on the bottom surface of the package substrate 1 as described in the first embodiment or be disposed in the recessed region R2 of the package substrate 1 as described in the second embodiment.

Figure 13A:
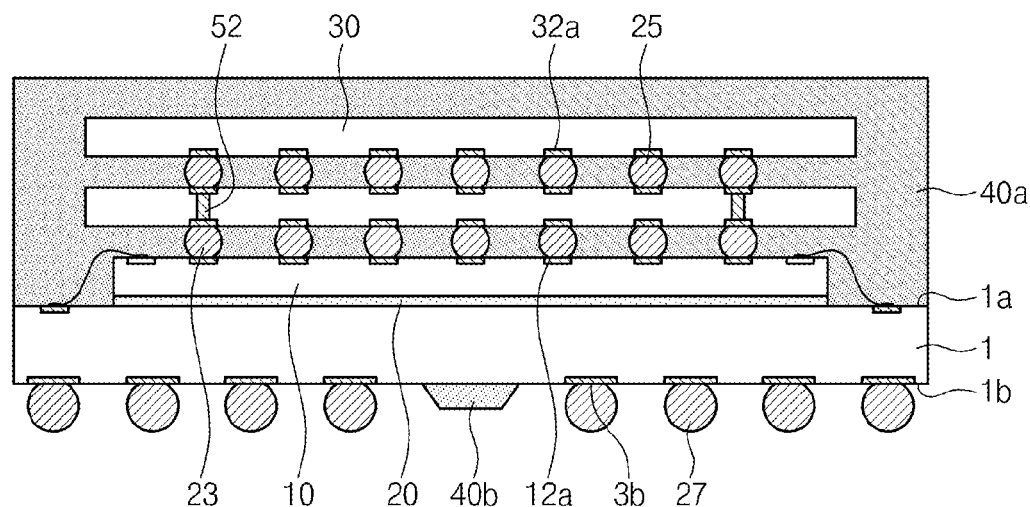
FIG. 13A is a cross-sectional view illustrating a modified example of FIG. 2A.

FIG. 13A is a cross-sectional view illustrating a modified example of FIG. 2A.

Referring to FIG. 13A, the structure of a first semiconductor chip 10 may be different from that of a second semiconductor chip 30 in a semiconductor package according to the present modified example. A size of the second semiconductor chip 30 may be greater than that of the first semiconductor chip 10. Additionally, a third semiconductor chip 50 may be disposed between the first semiconductor chip 10 and the second semiconductor chip 30. The third semiconductor chip 50 and the second semiconductor chip 30 may be mounted on the first semiconductor chip 10, for example, by a flip chip bonding method. The third semiconductor chip 50 may include through-vias 52. The through-vias 52 penetrate the third semiconductor chip 50. A first molding portion 40a fills spaces between the semiconductor chips 10, 30 and 50 without a void. Other elements of the semiconductor package according to the present modified example may be the same as/similar to the elements of the first embodiments corresponding thereto.

Figure 13B:
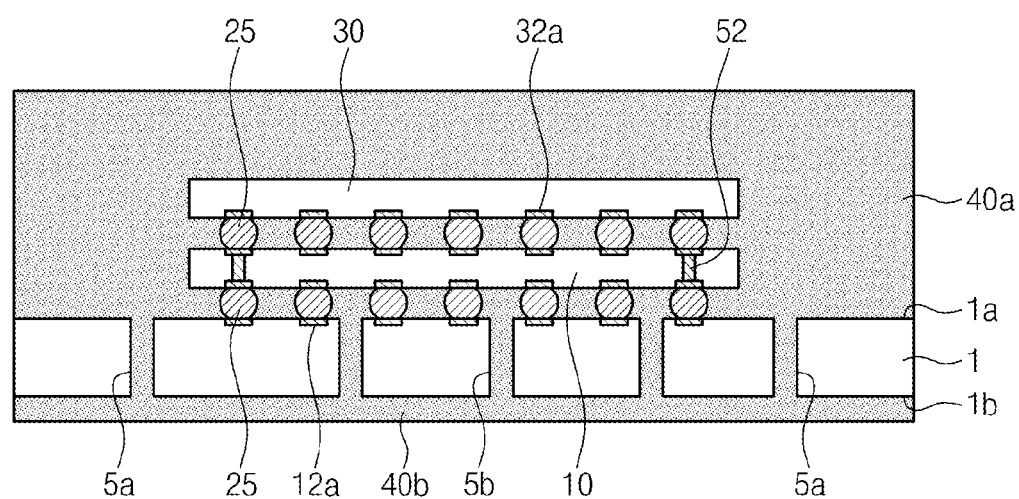
FIG. 13B is a cross-sectional view illustrating a modified example of FIG. 2B.

FIG. 13B is a cross-sectional view illustrating a modified example of FIG. 2B.

Referring to FIG. 13B, a package substrate 1 may include first and second holes 5a and 5b in a semiconductor package according to the present modified example. A first semiconductor chip 10 may be mounted on the package substrate 1 through bumps 25, for example, by a flip chip bonding method. A second semiconductor chip 30 may be mounted on the first semiconductor chip 10, for example, by a flip chip bonding method. A structure of the first semiconductor chip 10 may be different from that of the second semiconductor chip 30. The first semiconductor chip 10 may include through-vias 52 penetrating the first semiconductor chip 10. The first hole 5a may not overlap the semiconductor chips 10 and 30 but the second hole 5b overlaps the semiconductor chips 10 and 30. A second molding portion 40b fills the holes 5a and 5b and is connected to a first molding portion 40a through the holes 5a and 5b. The first molding portion 40a fills a space between the package substrate 1 and the first semiconductor chip 10 and a space between the first semiconductor chip 10 and the second semiconductor chip 30 without a void. The first hole 5a may serve to form the first molding portion 40a between the first and second semiconductor chips 10 and 30 without a void. The second hole 5b may serve to form the first molding portion 40a between the first semiconductor chip 10 and the package substrate 1 without a void. Other elements of the semiconductor package according to the present modified example may be the same as/similar to the elements of the first embodiments corresponding thereto.

In the embodiments of the inventive concept, a plurality of semiconductor chips 10 and 30 are stacked on the package substrate 1. Sizes of the semiconductor chips 10 and 30 may be equal to each other, or a size of an upper semiconductor chip 30 may be greater than that of a lower semiconductor chip 10. In this case, it may be difficult to fill a space between the semiconductor chips 10 and 30 with an underfill resin layer. Thus, if the hole 5 does not exist, the void may be formed between bumps by the difference in the speed of the flow of the resin solution for the molding layer 40a when the molding layer 40a is formed between the semiconductor chips 10 and 30. If the void exists between the bumps, the bumps may be melted and then come in contact with each other in the reflow process for mounting the package substrate 1 on the motherboard. Additionally, moisture may be collected in the void, such that the moisture may expand to burst the void in a high temperature process. However, according to embodiments of the inventive concept, the hole 5 exists in the package substrate 1, so that the molding layer 40a may be formed between the semiconductor chips 10 and 30 without the void.

The semiconductor package technique described above may be applied to various kinds of semiconductor devices and package modules including those.

Figure 14:
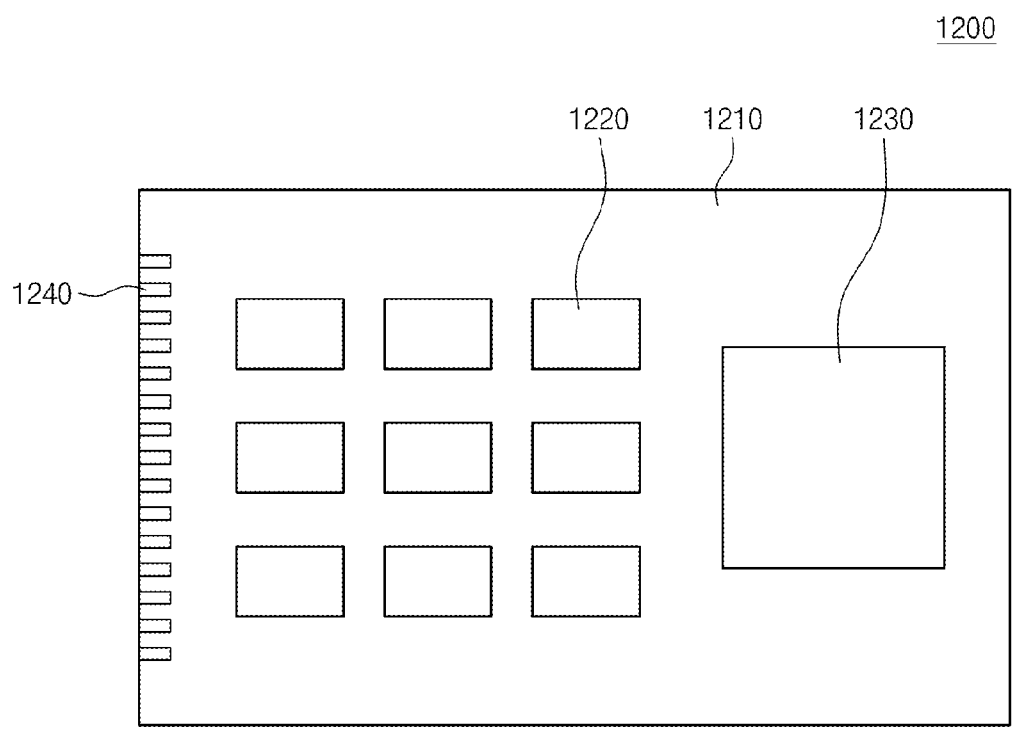
FIG. 14 shows an example of package modules including semiconductor packages according to embodiments of the inventive concept.

FIG. 14 shows an example of package modules including semiconductor packages according to embodiments of the inventive concept. Referring to FIG. 14, a package module 1200 may include a semiconductor integrated circuit chip 1220 and a semiconductor integrated circuit chip encapsulated by a quad flat package (QFP). The semiconductor devices 1220 and 1230 applied with the semiconductor package technique according to the inventive concept are installed on a substrate 1210 to form the package module 1200. The package module 1200 may be connected to an external electronic device through an external connecting terminals 1240 disposed at a side of the substrate 1210.

Figure 15:
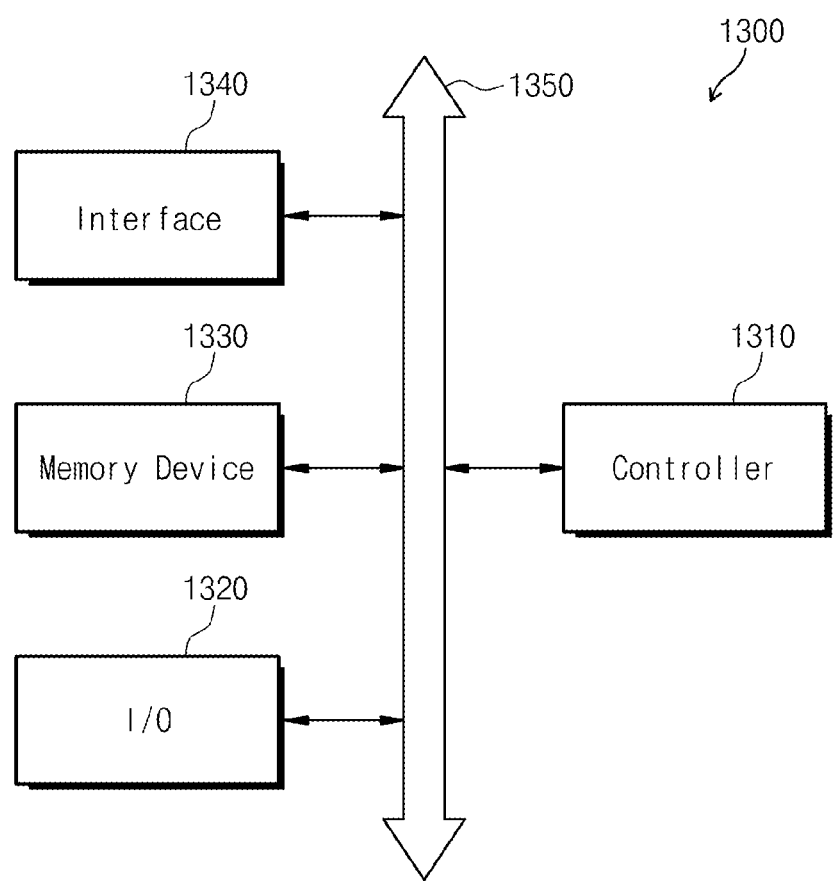
FIG. 15 is a schematic block diagram illustrating an example of electronic devices including semiconductor packages according to embodiments of the inventive concept.

The semiconductor package technique described above may be applied to electronic systems. FIG. 15 is a schematic block diagram illustrating an example of electronic devices including semiconductor packages according to embodiments of the inventive concept. Referring to FIG. 15, an electronic system 1300 may include a controller 1310, an input/output (I/O) unit 1320 and a memory device 1330. The controller 1310, the I/O unit 1320 and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller or other logic devices. The other logic devices may have a similar function to any one of the microprocessor, the digital signal processor and the microcontroller. The controller 1310 and/or the memory device 1330 may include at least one of the semiconductor packages according to embodiments of the inventive concept. The I/O unit 1320 may include a keypad, a keyboard and/or a display unit. The memory device 1330 stores logic data. The memory device 1330 may store data and/or commands performed by the controller 1310. The memory device 1330 may include a volatile memory device and/or a non-volatile memory device. The memory device 1330 may be formed of a flash memory device. For example, the semiconductor packages according to the inventive concept may be applied to information processing systems such as a mobile device and/or a desk top computer. The memory device 1330 may consist of a solid state disk (SSD). In this case, the electronic system 1300 may stably store massive data in the memory device 1330. The electronic system 1300 may include an interface unit 1340 which may transmit electrical data to a communication network or may receive electrical data from a communication network. The interface unit 1340 may include an antenna or a wireless or cable transceiver. Even though not shown in the drawings, an application chipset and/or a camera image processor (CIS), an input/output unit may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music player, a memory card and an information transmitting/receiving system. If the electronic system 1300 performs a wireless communication, the electronic system 1330 may be used in communication interface protocol such as CDMA, GSM, NADC, E-TDMA, WCDAM and/or CDMA2000.

Figure 16:
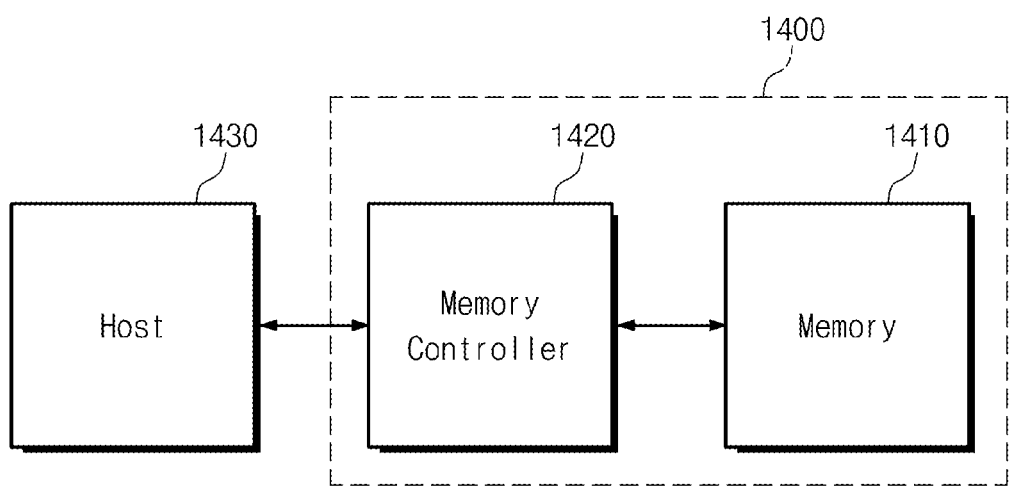
FIG. 16 is a schematic block diagram illustrating an example of memory systems including semiconductor packages according to embodiments of the inventive concept.

The semiconductor packages applied with the technique of the inventive concept may be applied to memory cards. FIG. 16 is a schematic block diagram illustrating an example of memory systems including semiconductor packages according to embodiments of the inventive concept. Referring to FIG. 16, a memory card 1400 may include a non-volatile memory device 1410 and a memory controller 1420. The non-volatile memory device 1410 and the memory controller may store data and/or read stored data. The non-volatile memory device 1410 may include at least one of non-volatile memory devices applied with the semiconductor package technique according to the aforementioned embodiments. The memory controller 1420 may read the stored data or store data in the non-volatile memory device 1410 in response to read/write request of a host 1430.

In the semiconductor package according to embodiments of the inventive concept, the molding layer fills the space between the semiconductor chips without the void. Thus, reliability of the semiconductor package may be improved. Additionally, the semiconductor package according to some embodiments includes the same kind of memory chips which are bonded to each other, such that the memory capacity of the semiconductor package may increase and the signal transmission speed of the semiconductor package may be improved. Thus, the semiconductor package may be applied to the next generation memory device.

In the methods of forming the semiconductor package according to embodiments of the inventive concept, the package substrate including the hole may be used. As described above, the hole is not overlapped with the semiconductor chips. The hole functions as an air vent in the process of forming the molding layer. Additionally, the flow of the resin solution for the molding layer may be maintained in a forward direction by the hole. Thus, the space between the semiconductor chips may be filled with the molding layer without the void by the hole. As a result, the short of the bumps is prevented and the problem caused by the moisture in the void may be prevented, so that the semiconductor package with improved reliability may be realized and production yield may increase. Additionally, the process forming the underfill resin layer is not needed, so that the processes for forming the semiconductor package may be simplified.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents and shall not be restricted or limited by the foregoing description.

What is claimed is:

1. A semiconductor package, comprising:
a package substrate including at least one hole;
a first semiconductor chip mounted on the package substrate and not overlapped with the at least one hole;
a second semiconductor chip mounted on the first semiconductor chip by a flip chip bonding method; and
a molding layer on the package substrate,
wherein the molding layer comprises:
a first molding portion covering the second semiconductor chip, the first semiconductor chip and the package substrate and filling a space between the first and second semiconductor chips; and
a second molding portion connected to the first molding portion through the at least one hole and disposed adjacent to a bottom surface of the package substrate,
wherein the first semiconductor chip has substantially the same structure as that of the second semiconductor chip; and the first semiconductor chip and the second semiconductor chip are substantially symmetrical to each other with respect to a bump disposed therebetween;
wherein the first semiconductor chip is connected with the package substrate by a bonding wire;
wherein the first semiconductor chip includes a first bonding pad in contact with the bump and a second bonding pad to which the bonding wire is bonded; and
wherein the second semiconductor chip includes a third bonding pad in contact with the bump and a fourth pad electrically insulated from the wire and the bump.

2. The semiconductor package of claim 1, wherein the same signal is configured to be transmitted to the first bonding pad and the third bonding pad.

3. The semiconductor package of claim 1, further comprising:
 a plurality of solder balls attached to the bottom surface of the package substrate,
 wherein the second molding portion is provided between the solder balls; and
 wherein the second molding portion has at least one of a line shape, a mesh-shape or a closed loop shape.

4. The semiconductor package of claim 3, wherein a distance from the bottom surface of the package substrate to a bottom surface of the second molding portion is smaller than a height from the bottom surface of the package substrate to a bottom end of the solder ball.

5. The semiconductor package of claim 1, wherein the second molding portion has a sidewall aligned with a sidewall of the package substrate.

6. The semiconductor package of claim 1, wherein the second semiconductor chip has a width equal to or wider than that of the first semiconductor chip.

7. The semiconductor package of claim 1, wherein a sidewall of the second semiconductor chip is aligned with a sidewall of the first semiconductor chip.

8. The semiconductor package of claim 1, wherein the first semiconductor chip is attached to the package substrate with an adhesive layer interposed therebetween.

9. The semiconductor package of claim 1, wherein the second molding portion covers the bottom surface of the package substrate; and
 wherein a bottom surface of the second molding portion protrudes from the bottom surface of the package substrate.

10. A semiconductor package, comprising:
 a package substrate including at least one hole extending therethrough;
 a first semiconductor chip mounted on the package substrate;
 a second semiconductor chip mounted on the first semiconductor chip; and
 a molding layer covering the first and second semiconductor chips,
 wherein the molding layer covers the second semiconductor chip, the first semiconductor chip and the package substrate, the molding layer has a part extending through the at least one hole and another part protruding from a bottom surface of the package substrate,
 wherein the another part of the molding layer comprises at least one line shape, each line shape extends in a first direction along the bottom surface of the package substrate and does not cross another line shape, and each line shape corresponds to at least one of the least one hole,
 wherein the first semiconductor chip has substantially the same structure as that of the second semiconductor chip,
 wherein the first semiconductor chip and the second semiconductor chip are substantially symmetrical to each other with respect to a bump disposed therebetween,
 wherein the first semiconductor chip is connected with the package substrate by a bonding wire,
 wherein the first semiconductor chip includes a first bonding pad in contact with the bump and a second bonding pad to which the bonding wire is bonded, and
 wherein the second semiconductor chip includes a third bonding pad in contact with the bump and a fourth pad electrically insulated from the wire and the bump.

11. The semiconductor package of claim 10, wherein the molding layer fills a space between the first and second semiconductor chips.

12. The semiconductor package of claim 10, wherein the semiconductor chip does not overlap the at least one hole.

13. The semiconductor package of claim 11, wherein the molding layer has substantially no void.

* * * * *